US006787052B1

(12) United States Patent
Vaganov

(10) Patent No.: US 6,787,052 B1
(45) Date of Patent: Sep. 7, 2004

(54) METHOD FOR FABRICATING MICROSTRUCTURES WITH DEEP ANISOTROPIC ETCHING OF THICK SILICON WAFERS

(76) Inventor: Vladimir Vaganov, 129 El Porton, Los Gatos, CA (US) 95032

( * ) Notice: Subject to any disclaimer, the term of this patent is extended or adjusted under 35 U.S.C. 154(b) by 358 days.

(21) Appl. No.: 09/596,837

(22) Filed: Jun. 19, 2000

(51) Int. Cl.[7] ............................. C23F 1/00; H01L 21/302
(52) U.S. Cl. ............................ 216/57; 216/79; 216/99; 438/704
(58) Field of Search ....................... 216/57, 79, 99; 438/719, 734, 704, 733, 749, 742, 750, 753, 725

(56) References Cited

U.S. PATENT DOCUMENTS

| 5,857,885 A | * | 1/1999 | Laou et al. ............... 445/24 |
| 6,043,135 A | * | 3/2000 | Noda ........................ 438/404 |
| 2002/0094665 A1 | * | 7/2002 | Villa et al. ................ 438/479 |

FOREIGN PATENT DOCUMENTS

DE        4037202     *  5/1992

\* cited by examiner

*Primary Examiner*—George A. Goudreau
(74) *Attorney, Agent, or Firm*—Thomas E. Schatzel; Law Offices of Thomas E. Schatzel A Prof. Corp.

(57) ABSTRACT

A method for fabricating semiconductor microstructures with a combination of etching steps, i.e. local RIE, isotropic, etc. followed by deep anisotropic etching.

115 Claims, 18 Drawing Sheets

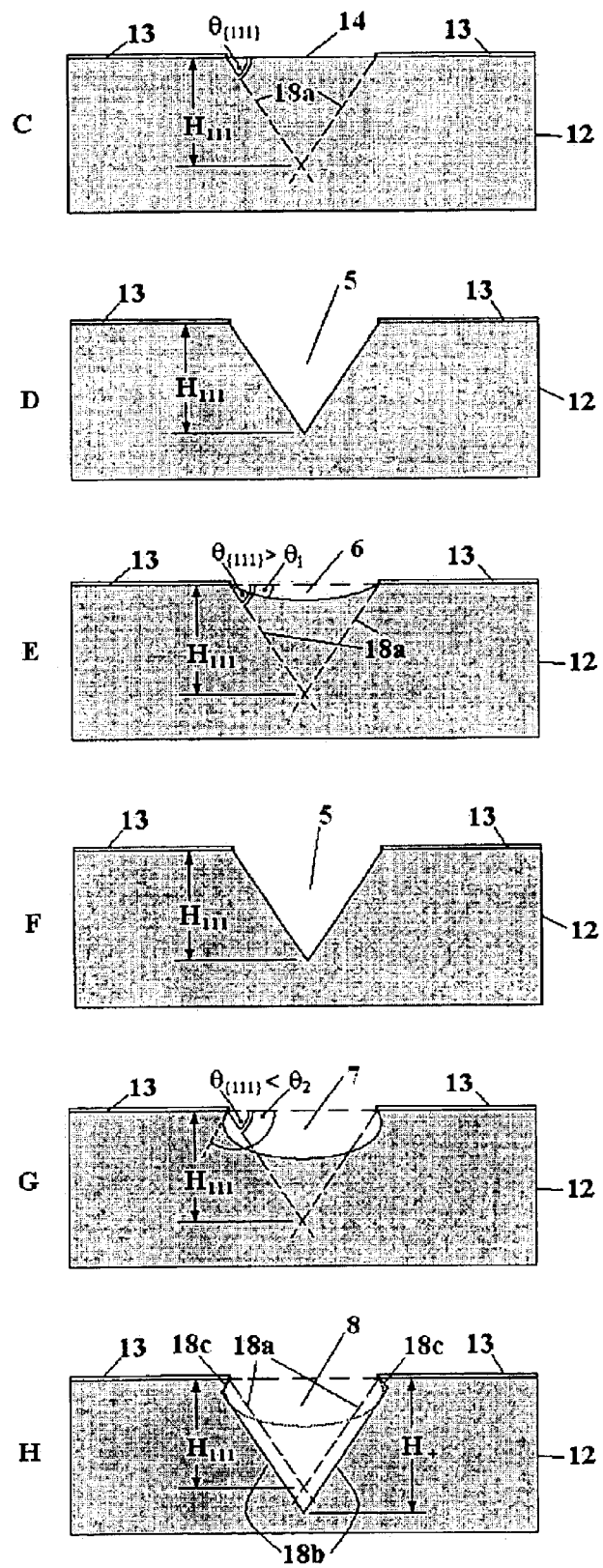
Fig. 1(C)-(H)

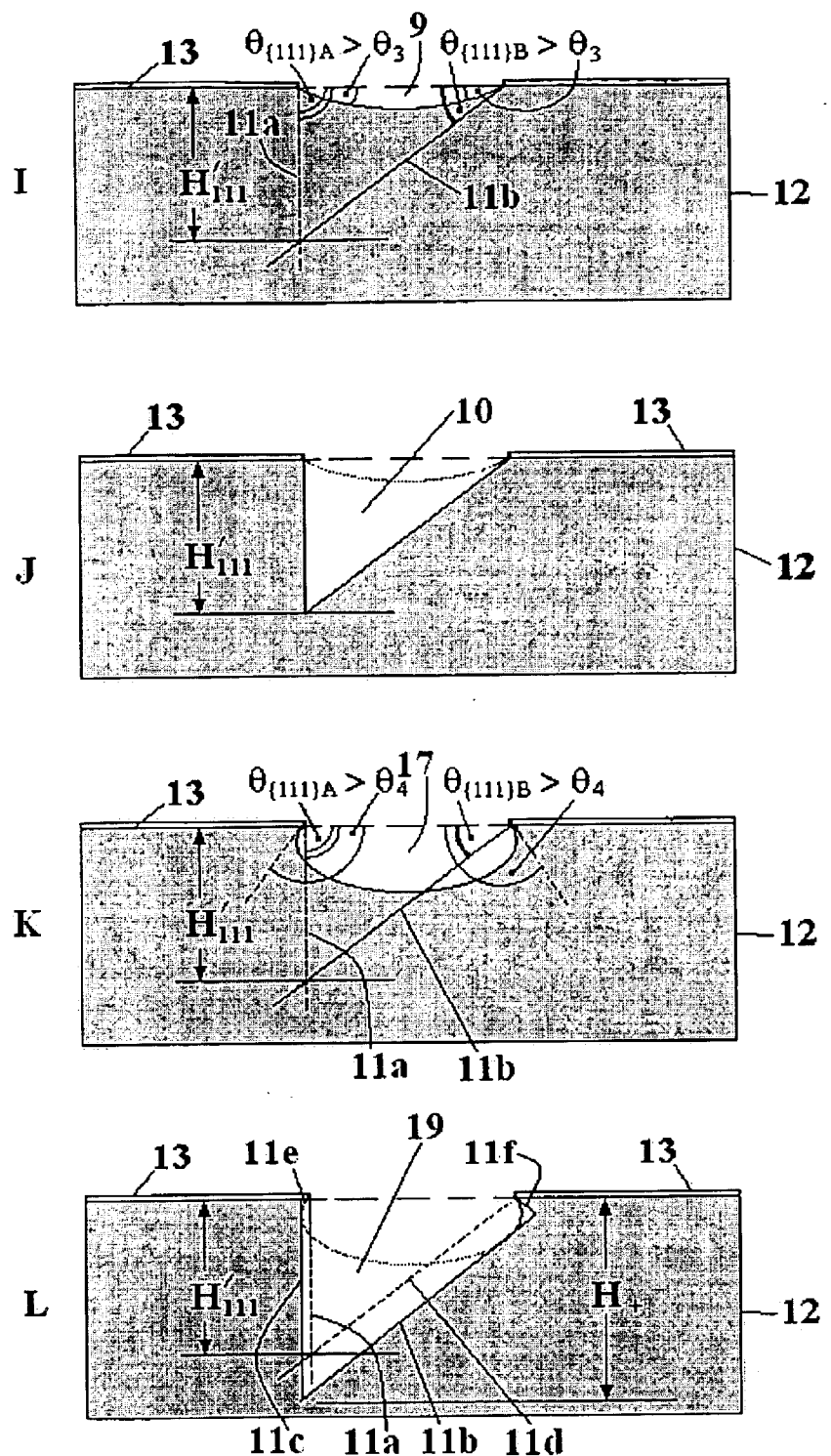
Fig. 1(I)-(L)

Fig. 13 A and B

Fig. 14 A and B

METHOD FOR FABRICATING MICROSTRUCTURES WITH DEEP ANISOTROPIC ETCHING OF THICK SILICON WAFERS

BACKGROUND OF THE INVENTION

1. Field of the Invention

This invention relates to semiconductor devices, and more specifically to fabrication methods for deep (comparable to the thickness of the semiconductor wafer) etching that do not require expanded device surface areas when scaling up to larger diameter and thicker wafers.

2. Description of the Prior Art

Various kinds of semiconductor devices micro-sensors, micro-actuators and microstructures require fabricating deep cavities in the monocrystalline silicon substrates. For example, for integrated silicon pressure sensors the initial wafer may be locally etched from the back side through almost the entire thickness to form a thin silicon diaphragm. Similar deep etching (sometimes referred to as bulk micromachining) is used for other sensors and microstructures. For example, piezoresistive accelerometers, ink-jet print-heads, gas sensors, thermopiles, chemical sensors, silicon micro-valves, micro-relays, optical fiber aligners and others use deep silicon etching.

In the fabrication of piezoresistive accelerometers or print heads for ink-jet printers, the surface of an initial silicon wafer may have crystallographic orientation (100). During the fabrication process the wafer is etched locally from the backside to form a silicon diaphragm. Then for the print-head, the nozzles are etched in the diaphragm, or for the accelerometer the diaphragm is locally etched through to form the required shape of the suspension.

Prior art etching techniques often use wet anisotropic etching. As anisotropic wet etching is a batch process, the productivity is very high and cost is low compared to the other processes for silicon micromachining. FIGS. 1(A)–(B) show a cavity 1 formed by wet anisotropic etching of a (100) silicon wafer 2. The shape of the cavity 1 is determined by four {111} planes 3. The etch rate of {111} planes 3 can be several hundred times less than the vertical etch rate of the wafer 2. As a result, the position of the planes 3 remains substantially constant during etching and is determined by the layout of the etching mask and its orientation with respect to the crystallographic directions on the surface of the wafer. In many cases, the etched depth can be well controlled within 0.1–0.5 um with good uniformity across the wafer.

Low cost, high productivity, high accuracy, excellent uniformity and surface quality make wet anisotropic etching a desirable process for deep silicon micromachining. Among some disadvantages of anisotropic etching of (100) orientation silicon is the loss of real estate on the die and wafer surface. As indicated by FIGS. 1(A)–(B), the {111} side walls 3 of the etched cavity 1 have about 54 degrees angle to the initial (100) surface of the wafer 2. In order to receive, for example, a square diaphragm 4 with the side one mm, the size of the mask for deep etching to a depth H should be $(1+H\sqrt{2})$mm. A silicon wafer of four inches in diameter usually has a thickness of 0.4 mm. Therefore, the mask for 1 mm diaphragms and for deep (almost through) etching should be 1.56 mm. If the width of the frame around the cavity is 0.47 mm, then the total size of the die will be 2.5×2.5 mm and a four inch wafer will have about 1000 dies. Theoretically, transition to a six inch wafer should result in doubling the number of dies (of the same size) because the area is 2.25 times larger than the area of a four inch wafer. However, the thickness of a six 6 inch wafer is larger and usually equals at least 0.6 mm. Therefore, in order to fabricate the same one mm diaphragm, the mask should be 1.85 mm. With the same width of the frame the size of the die will be 2.79×2.79 mm instead of 2.5×2.5 mm, resulting in a loss of a minimum of 500 dies on each wafer.

Therefore, there is a need for a process of deep micromachining of silicon wafers which will allow about the same real estate for the mask at the surface of the wafer to form the cavities with different depths and the same size at the bottom (diaphragm). This would allow for decrease in the size of the die and its cost.

SUMMARY OF THE PRESENT INVENTION

An object of the present invention is to provide a method for decreasing the size and the cost of a die containing microstructures fabricated with deep anisotropic etching using at least a two-step micromachining of monocrystalline silicon wafers.

Another object of the present invention is to provide a method of fabricating cavities with the same size at the bottom (diaphragm) and with an opening mask, which is independent of the initial thickness of the silicon wafer.

Another object of the present invention is to provide a method of micromachining holes through the wafer with the opening mask, which is independent of the initial thickness of the silicon wafer.

Another object of the present invention is to provide a method of micromachining of monocrystalline silicon wafers, which allows fabricating microstructures inside the center of the die and local profiling of the outer surface of the die.

Another object of the present invention is to provide a method for micromachining of bar or grid-like microstructures, which provide additional mechanical strength of the die, and mechanical protection of microstructures inside the cavity, and the protective element and other elements (like diaphragm) can be fabricated within the same wafer and during the same process.

Another object of the present invention is to provide a method for micromachining of bar or grid-like microstructures, which after forming a cavity beneath their structures, can be used as a mask for local etching at the bottom of the cavity.

Another object of the present invention is to provide a method of fabricating channels and cavities completely inside a monocrystalline silicon wafer wherein these channels and cavities can be connected to the surface of the wafer in certain locations and can be used, for example, in microfluidics.

Another object of the present invention is to provide a method of fabricating sealed cavities or channels inside a monocrystalline silicon wafer, for example, for use as for absolute pressure sensors.

A preferred embodiment of the silicon wafer micromachining of the present invention comprises a combination of other than anistropic deep etching of silicon wafers followed by deep anisotropic etching. The additional etching or deposition of different materials allows fabricating various microstructures for numerous applications.

BRIEF DESCRIPTION OF THE DRAWINGS

FIGS. 1(A)–(B) are top and side cross-sectional views of a monocrystalline silicon wafer with a pyramidal cavity micromachined therein by wet anisotropic etching of the prior art, while FIGS. 1(C)–(L) are side cross-sectional diagrams illustrating cavities etched in a silicon wafer by various series of processing steps, some according to various preferred embodiments of the present invention.

FIGS. 15(A)–(C) illustrate further structures fabricated in a silicon wafer according to the present invention.

DETAILED DESCRIPTION OF THE PREFERRED EMBODIMENTS

Before describing in detail the preferred embodiments of the present invention, it is worthwhile to further discuss the effects of the use of wet anisotropic etching to form a cavity in a silicon wafer and the make comparisons to situations in which wet anisotropic etching is not performed until after an initial cavity has been formed in the silicon wafer using some etching technique other than wet anisotropic etching. This discussion, along with the accompanying illustrative figures, will serve to clarify description of the preferred embodiments.

As discussed briefly in the Description of Prior Art, the effect of wet anisotropic etching on the geometry of silicon structures is characterized by the fact that the etch rate in <111> crystallographic directions—that is, in directions perpendicular to {111} planes in the crystallographic structure of silicon—can be several hundred times less than in other directions, for example, <100> directions (i.e. in directions perpendicular to {100} planes). Hence, the shape of any cavity formed in silicon by wet anisotropic etching is essentially determined by {111} planes since these serve to act as "walls". Since {111} planes are at an angle with respect to the surface of, for example, (100) or (110) silicon wafers (the two most common types used in silicon micromachining), these {111} planes (which act as walls) limit the etch depth realizable through openings defined on the surface of the wafer by the use of etching masks. The shape of a cavity is determined by: the size and shape of the opening, its orientation with respect to crystallographic directions, and {111} planes.

Figure 1:
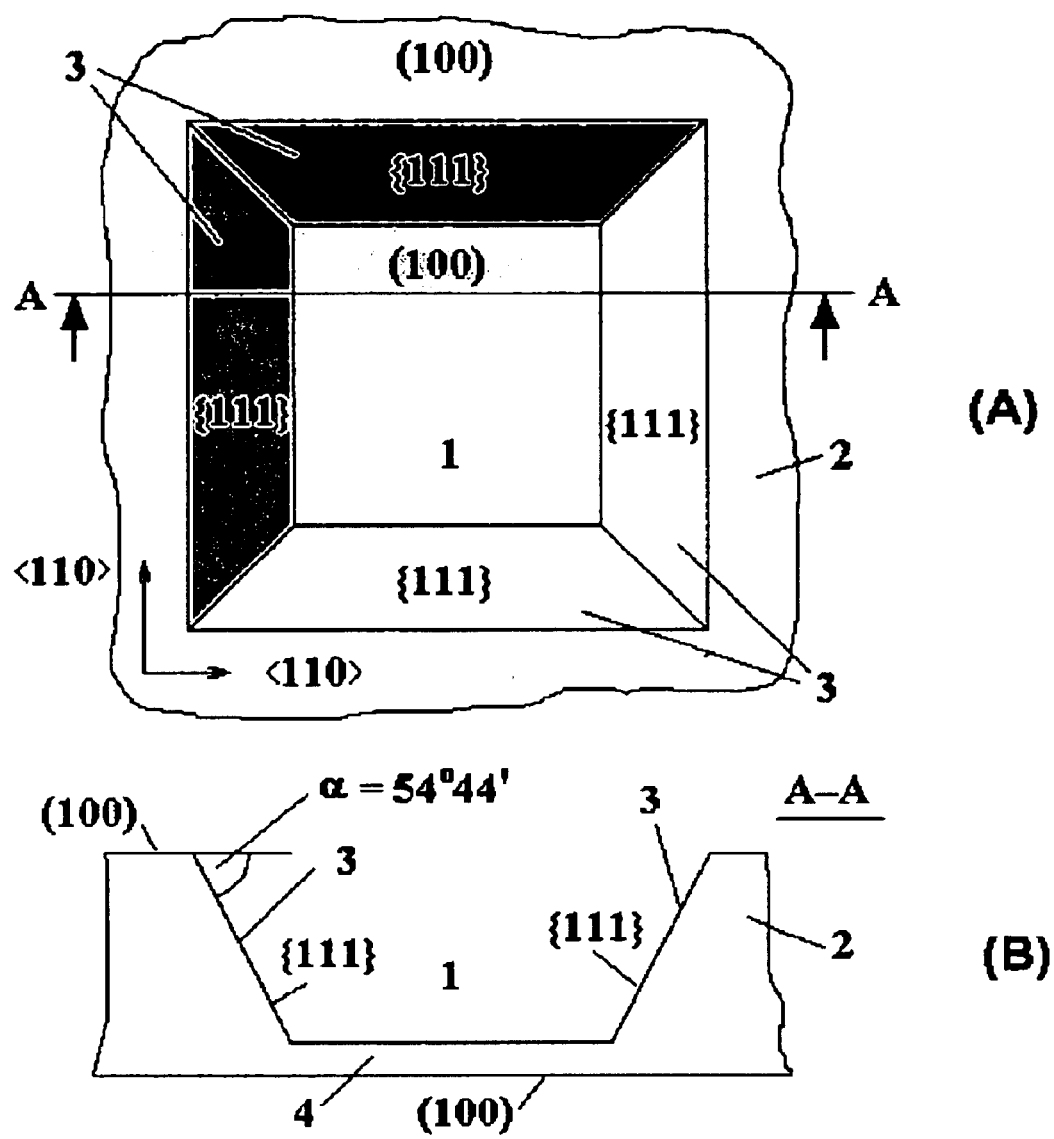

A consequence of this observation is that the etch depth achievable using wet anisotropic etching is limited by the size of the opening on the wafer surface and {111} planes. This observation is illustrated in FIGS. 1(C)–(D). In FIG. 1(C) is shown a cross-sectional view of a (100) silicon wafer 12. A square opening 14 has been defined on its surface with the layout of the etching mask 13 being such that the edges of the square opening are aligned with <110> crystallographic directions. The dashed lines show two {111} planes 18a having the smallest angle $^o\{111\}$ with respect to the surface of the wafer in the region of the opening. Since wet anisotropic etching in directions perpendicular to {111} planes can be hundreds of times slower than in, say, directions perpendicular to {100} planes (which are parallel to the surface of (100) wafer), these dashed lines also represent the approximate position of the walls of the cavity which would be formed using wet anisotropic etching; this resulting cavity 5 is pictured in FIG. 1(D). The depth of this cavity is $^H111$. In order to increase the achievable etch depth it would be necessary to increase the size of the opening 14, thereby increasing the overall size of the structure and reducing the total number of such structures batch-fabricated on a single silicon wafer. This results in a higher cost of manufacturing.

One of the main objects of the present invention is to mitigate this limitation on achievable etch depth using wet anisotropic etching given an opening fixed size. Once such an opening is defined on the surface of the wafer, if some etching technique other than wet anisotropic etching is first used to form an initial cavity, it may be possible to achieve a greater etch depth than would be achievable using wet anisotropic etching alone. Whether the achievable etch depth will be increased or not will depend on the angle between the surface of the wafer and the walls of the initial cavity. It this angle is smaller than the smallest angle between the wafer surface and {111} planes then the etch depth will not be increased. However, if the angle between the wafer surface and the walls of the initial cavity is greater than the smallest angle between the wafer surface and {111} planes then the achievable etch depth will be increased. These observations are elucidated in FIGS. 1(E)–(H) and FIGS. 1(I)–(L) which we now discuss.

In FIG. 1(E) is shown the same cross-sectional view of a (100) wafer 12 with the opening 14 defined as in FIG. 1(C). However, here an initial cavity 6 has been formed using some etching technique other than wet anisotropic etching. The walls of this cavity are such that the (tangents to the) walls of the wafer surface form an angle $\theta 1$ with respect to the wafer surface in the region of the opening. Note that $\theta 1 < ^\theta\{111\}$, where $^\theta\{111\}$ is the smallest angle between the $\{111\}$ planes 18a and the surface of the wafer 12 in the region of the opening 14. If wet anisotropic etching is now performed etching will proceed in all directions normal to the surface of the initial cavity, but the rate it still several hundred times slower in directions perpendicular to $\{111\}$ planes. Hence, the final form of the cavity will be as shown in FIG. 1(F); that is, it is identical to the cavity 5 shown in FIG. 1(D).

In FIG. 1(G) is again shown a cross-sectional view of a (100) wafer 12 with the opening 14 defined as in FIG. 1(C). An initial cavity 7 has been formed using some etching technique other than wet anisotropic etching. The walls of this cavity are such that the (tangents to the) walls of the water surface form an angle $\theta 2$ with respect to the wafer surface in the region of the opening 14. Unlike in FIG. 1(E), the angle between the walls of the initial cavity and the wafer surface is greater than the smallest angle between $\{111\}$ planes 18a and the wafer surface in the region of the opening; that is $\theta 2 > ^\theta\{111\}$. In this case subsequent use of wet anisotropic etching will result in a cavity 8 of the form shown in FIG. 1(H). The walls of the cavity again correspond to $\{111\}$ planes 18b, but these are different $\{111\}$ planes than those (18a) which defined the cavity in FIGS. 1(D) and (F). The "kink" in the walls near the opening 14 results from still other $\{111\}$ planes 18c which have served to retard etching in <111> directions. Note that, although the size of the opening 14 in FIG. 1(G) remains identical to that in FIGS. 1(C) and (E), the overall depth $^H+$ of the cavity 8 is greater than that (i.e. cavity 5, which has a depth of $^H 111$) achieved using wet anisotropic etching without an initial step of etching using a technique other than wet anisotropic etching.

The advantages accrued through the use of this method of fabricating semiconductor microstructures are not restricted to (100) silicon wafers. Although somewhat more complicated to visualize, consider a (110) silicon wafer. In this case the $\{111\}$ planes do not all have the same angle with respect to the surface of the wafer. In FIGS. 1(I)–(L) are shown analogous figures to those appearing in FIGS. 1(E)–(H) except that here the wafer is a (110) silicon wafer, rather than (100), and the opening is no longer square. Instead, the opening has the shape of parallelogram with sides parallel to the <110> and <211> crystallographic directions. The cross-section shown in along a <100> direction. In this case the angle between $\{111\}$ planes and the surface of the wafer is not unique. Some $\{111\}$ planes 11a are perpendicular to the surface of the wafer (i.e. they form an angle $^\theta\{111\}A = 90$ deg with the wafer surface) while others 11b are at an angle $^\theta\{111\}B$ with the respect to the wafer surface, where $^\theta\{111B\}$ is different than the angle $^\theta\{111\}$ of the $\{111\}$ planes 18a with the respect to the (100) wafer surface in FIGS. 1(C)–(H). Independent of the orientation of the $\{111\}$ planes, the etching rate for wet anisotropic etching remains several hundred times slower for directions perpendicular to $\{111\}$ planes.

In FIG. 1(I) an initial cavity 9 has been formed using a technique other than anisotropic etching. The walls of this cavity are such that the (tangents to the) walls at the wafer surface form an angle $\theta 3$ with respect to the wafer surface in the region of the opening. Note that $^\theta 3 < ^\theta\{111\}A$ and $^\theta 3 < ^\theta\{111\}B$, where $^\theta\{111\}A$ and $^\theta\{111\}B$ are the smallest angles between the $\{111\}$ planes 11a and 11b, respectively, and the surface of the wafer in the region of the opening. If wet anisotropic etching is now used the shape of the resulting cavity 10 will be as shown in FIG. 1(J); that is, it is has depth $^H 111$ and is identical to the cavity which would be formed with wet anisotropic etching without an initial non-wet anisotropic etching step.

However, it, as in FIG. 1(K), an initial cavity 17 is formed by an etching technique other than wet anisotropic etching such that the angles between the wafer surface and the tangents to the walls at the wafer surface in the region of the opening are greater than the angles between the various $\{111\}$ planes 11a and 11b and the wafer surface in the region of the opening, then the final shape of the cavity 19 after the subsequent use of wet anisotropic etching will have the form shown in FIG. 1(L). The cavity is now determined by the $\{111\}$ planes 11c–f. With the use of an initial etching technique other than wet anisotropic etching the depth $^H+$ of the resulting cavity 19 is greater than that achievable using wet anisotropic etching only (i.e. depth $^H 111$), even though the shape and size of the initial opening has remained unchanged.

It is apparent from the preceding discussion and the related figures that the formation of an initial cavity using some etching technique other than wet anisotropic etching can be highly beneficial in terms of increasing the achievable etch depth given an opening of fixed size. This is now illustrated further in the context of the preferred embodiments of the present invention.

The drawings illustrate various profiles, which can be obtained by employing a combination of deep anistropic etching with at least one other type of etching. A detailed description of the process according to the present invention, which can be used for forming such profiles is provided hereafter in the following description of the various embodiments.

Figure 2:
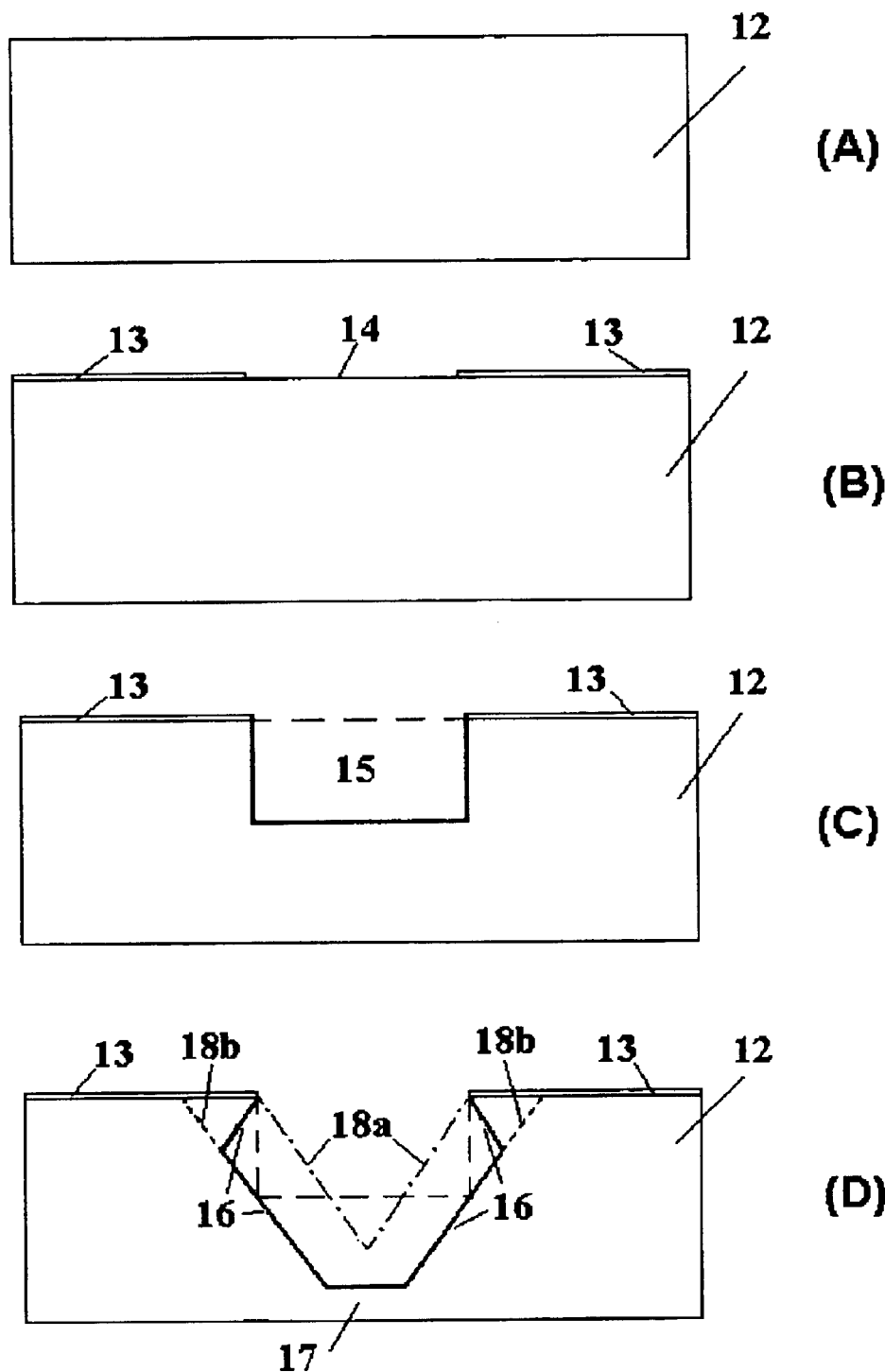
FIGS. 2(A)–(D) are side cross-sectional diagrams illustrating cavities etched in a silicon wafer and representing a series of processing steps in a method according to a first embodiment of the present invention.

Referring to the embodiment of FIGS. 2(A)–(D), a cross-section of a silicon wafer 12 is shown in FIG. 2(A). Before micromachining, the water 12 has uniform thickness. A protective mask layer 13 is formed on at least one side of the wafer 12 as shown in FIG. 2(B). An opening 14 in the mask layer 13 is defined by one of the known techniques, for example, by photolithography. The protective mask layer may contain silicon dioxide, silicon nitride, silicon carbide, photoresist, polyimide or metal.

The first step of the micromachining process is a local RIE (reactive ion etching) or other etching method, which allows for a cavity 15 profile with vertical walls. The term "vertical" herein means that the angle between the side wall of the cavity 15 and the top surface of the wafer is approximately 90°, although it can be slightly smaller or larger than 90° depending on the process. Commercially available are equipment and processes which provide for the formation of cavities with vertical walls in monocrystalline silicon wafers. In order to simplify the description, this step is referred to as the RIE step or as first RIE step.

Micromachining of the silicon wafer 12 can be continued after the RIE step using wet anisotropic etching. Well-known in the art, etchants such as potassium hydroxide (KOH), alkali metal hydroxides, tetramethyl-ammonium hydroxide, ethylenediamine, gallic acid or hydrazine can be used at this step. The profile shown in FIG. 2(D) can be obtained after wet anisotropic etching. The shape of the cavity is determined by $\{111\}$ planes 16. Position of the bottom plane determines both thickness and size of a diaphragm 17. To further expedite, the anisotropic etching can be performed in the presence of ultrasonic or megasonic vibrations in the etching solution.

To illustrate the benefit of the initial RIE step, if anisotropic etching were used without the first RIE step with the opening 14 of the initial size, then the shape of the cavity would be determined by (111) planes 18a and intersect above the surface of diaphragm 17. As illustrated by 2(D), the diagram 17 with the same thickness as that formed with the combined RIE and wet anisotropic etching cannot be obtained by the wet anisotropic etching only and using the initial size opening 14. The combination of RIE and wet anisotropic etching allows for increasing the surface size of the diaphragm 17 and decreasing the thickness of the diaphragm without altering the size of the wafer die. In order to get the same size of the diaphragm 17 using wet anisotropic etching only, it would be necessary to use larger size of the initial opening 14 as illustrated by the broken line planes 18b. As illustrated by FIG. 2(D), for a given size of diaphragm 17 the combination of RIE and wet anisotropic etching provides for decreasing the size of the initial opening 14 for micromachining and, consequently, die size decreasing.

Figure 3:
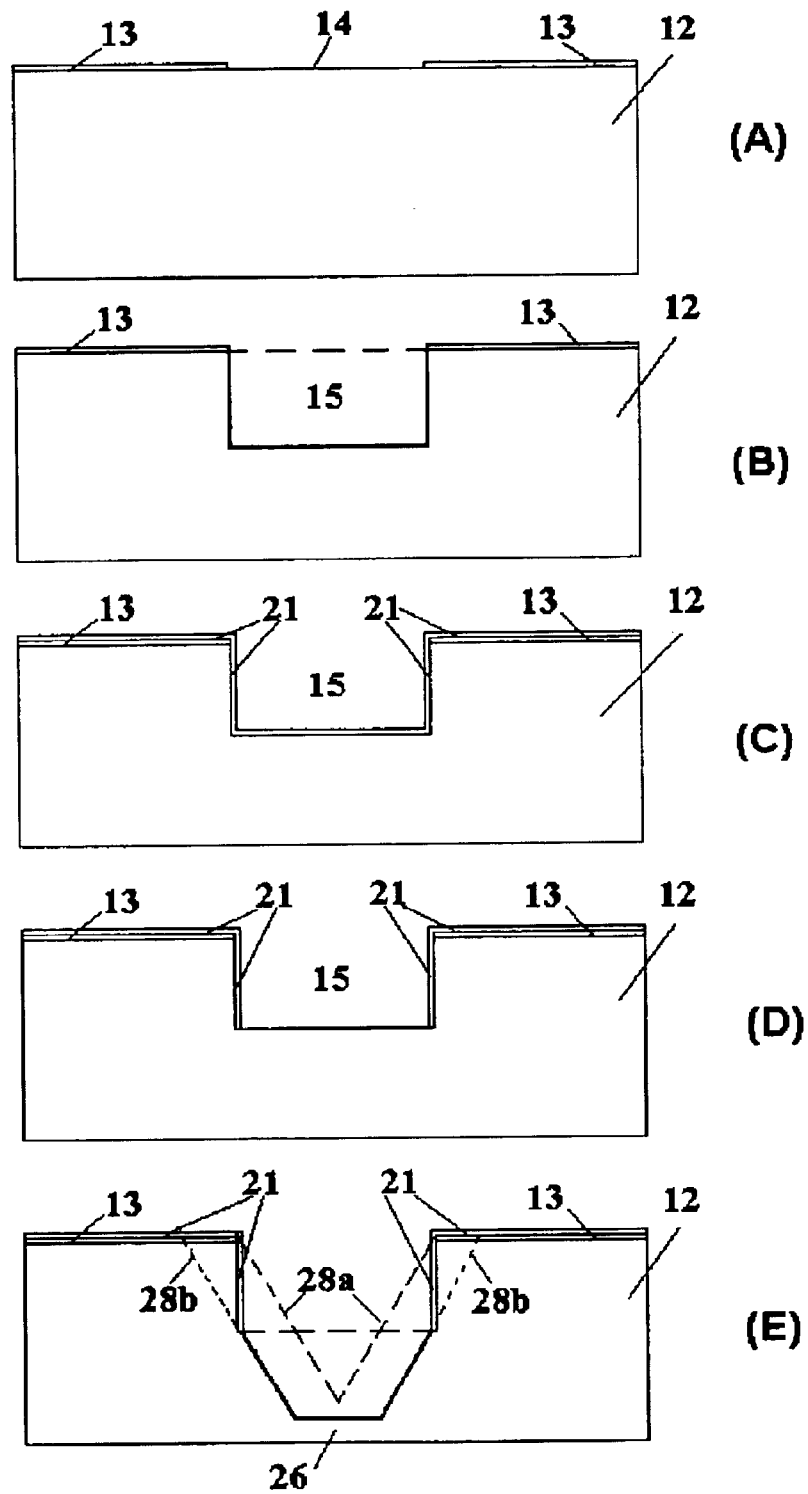
FIGS. 3(A)–(E) are side cross-sectional diagrams illustrating cavities etched in a silicon wafer and representing a series of processing steps in a method according to a second embodiment of the present invention.

In the processing according to a second embodiment, as illustrated in FIGS. 3(A)–3(E), the initial etch step is a local RIE etch, while is performed as described in the first embodiment. Then the surface of the cavity 15 and layers 13 are covered with a mask layer 21 as shown in FIG. 3(C). For example, the layer 21 can be done by thermal oxidation, or LPCVD, or PECVD oxide/nitride deposition. The mask layer 21 is then removed from the bottom of cavity 15 as shown in FIG. 3(D). Wet anisotropic etching at the next step then provides formation of the profile shown in FIG. 3(E). The position of the bottom plane determines both thickness and size of a diaphragm 26. If anisotropic etching were used without the RIE, masking and mask removal steps and the size of the initial opening 14 remained the same, then the shape of the cavity would be determined as illustrated by the broken line planes 28a. Again, the planes 28a intersect considerable above and therefore the diaphragm surface area is smaller and the diaphragm is thicker. As illustrated in FIG. 3(E), a diaphragm with the same thickness as that formed with the combined RIE and wet anisotropic etching cannot be obtained by the wet anisotropic etching only and using the initial size of the opening 14. However, the combination of RIE and wet anisotropic etching allows increasing the size of the diaphragm for the same size of wafer die. To realize the same size of diaphragm using wet anisotropic etching only, necessitates use of a larger size initial opening 14 with the shape of the cavity being determined as illustrated by planes 28b. As illustrated in FIG. 3(E), for the same size of diaphragm the combination of RIE and wet anisotropic etching allows for die size decreasing.

Figure 4:
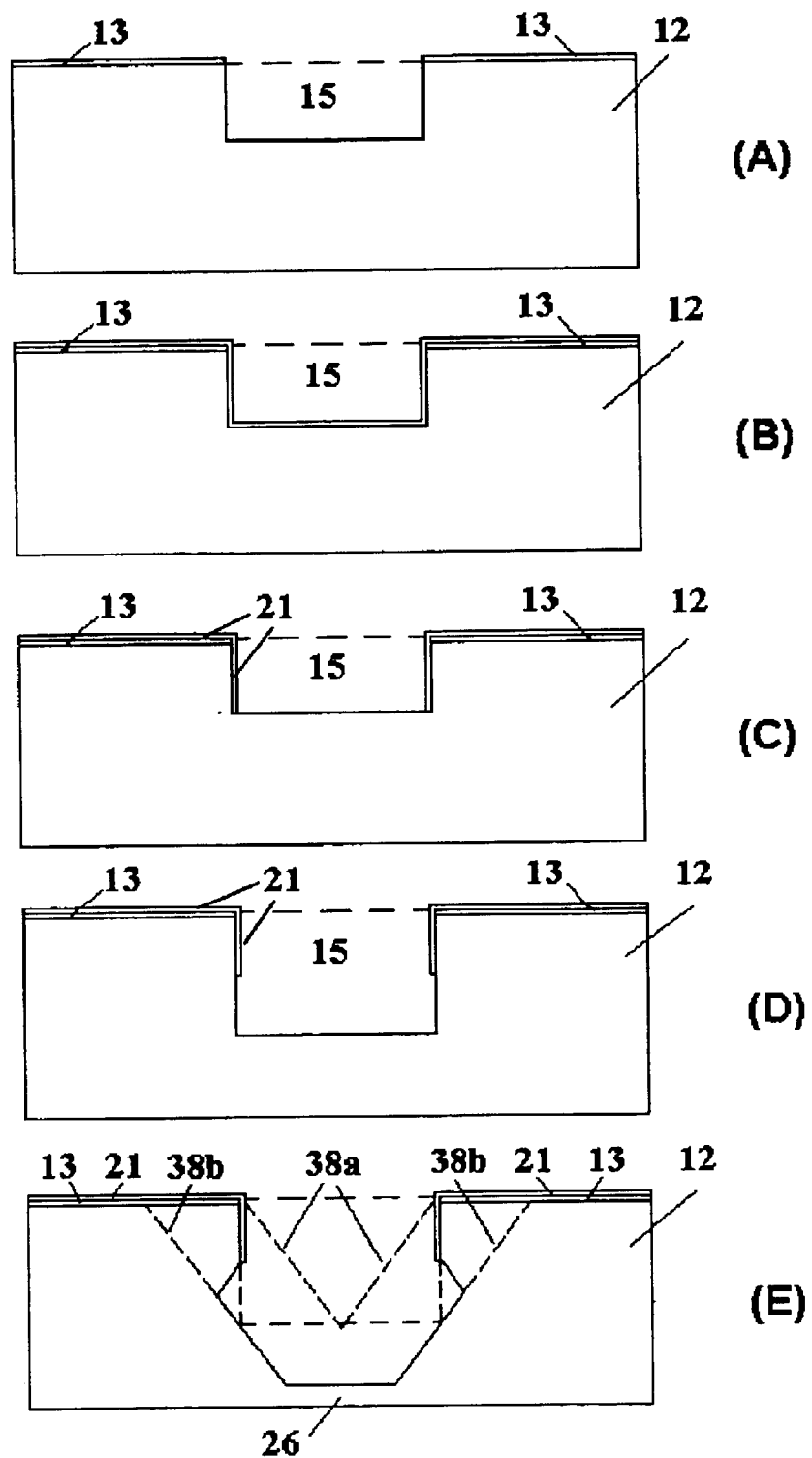
FIGS. 4(A)–(E) are cross-sectional diagrams illustrating cavities etched in a silicon wafer and representing a series of processing steps in a method according to a third embodiment of the present invention.

As illustrated in FIGS. 4(A)–(E), in the process according to a third embodiment, the major initial steps are after masking off the wafer 12, and forming the opening 14 in the mask 13 as in FIG. 2(A)–(B) are as follows: (a) local RIE etch to form cavity 15 (see FIG. 4(A)); (b) masking the side walls and bottom plane of the cavity 15 (see FIG. 4(B)); and (c) removing mask 21 from the bottom plane of the cavity (see FIG. 4(C)). These steps are performed as previously described in the second embodiment (see FIGS. 3(B)–3(D). Then, a second silicon etch step, which allows for forming a deeper cavity 15 profile with the vertical walls. The second silicon etch step can be performed by the same process as the first wafer etch step, or a different process can be used. To simplify the description, this step is referred to as the second RIE step. The profile of the cavity 15 after the second RIE step is shown in FIG. 4(D). The side walls of the cavity 15 remain vertical. The difference between profile shown in FIG. 2(C) and FIG. 4(D) is that in the FIG. 2(C) profile the side walls of the cavity 15 are not covered with the mask layer 21. In the FIG. 4(D) profile, side walls of the cavity 15 are partially covered by the mask 21. Wet anisotropic etching is then used at the next step and the profile of the cavity after wet anisotropic etching is shown in FIG. 4(E).

If anisotropic etching were used without the above described RIE steps and the initial opening was of the same size, then the shape of the cavity would be determined by {111} planes 38a. As it can be seen from FIG. 4(E), a diaphragm with the same thickness as that formed with the combined RIE and wet anisotropic etching cannot be obtained by the wet anisotropic etching only using the initial size of the opening 14. The combination of RIE and wet anisotropic etching steps allow increasing size of the diaphragm 26 for the same size of the die. In order to get the same size of the diaphragm 26 using wet anisotropic etching only it is necessary to use a larger initial opening 14. When the size of the opening 14 is larger, then the shape of the cavity is still determined by the illustrated broken line planes 38b. As illustrated by FIG. 4(E), for the same size of the diaphragm 26, the combination of RIE and wet anisotropic etching allows for a decreased size of initial opening 14. The smaller size initial opening 14 allows for decreased size of wafer die.

As illustrated in FIGS. 5(A)–5(E), the process according to a fourth embodiment includes major initial steps of masking of the wafer 12 and forming the opening 14 in the mask 13 followed by: (a) local RIE etch (FIG. 5(A)); (b) masking the side walls and bottom plane of the cavity 15 (see FIG. 5(B)): (c) removing mask 21 from the bottom plane of the cavity 15 (see FIG. 5(C)).

Figure 5:
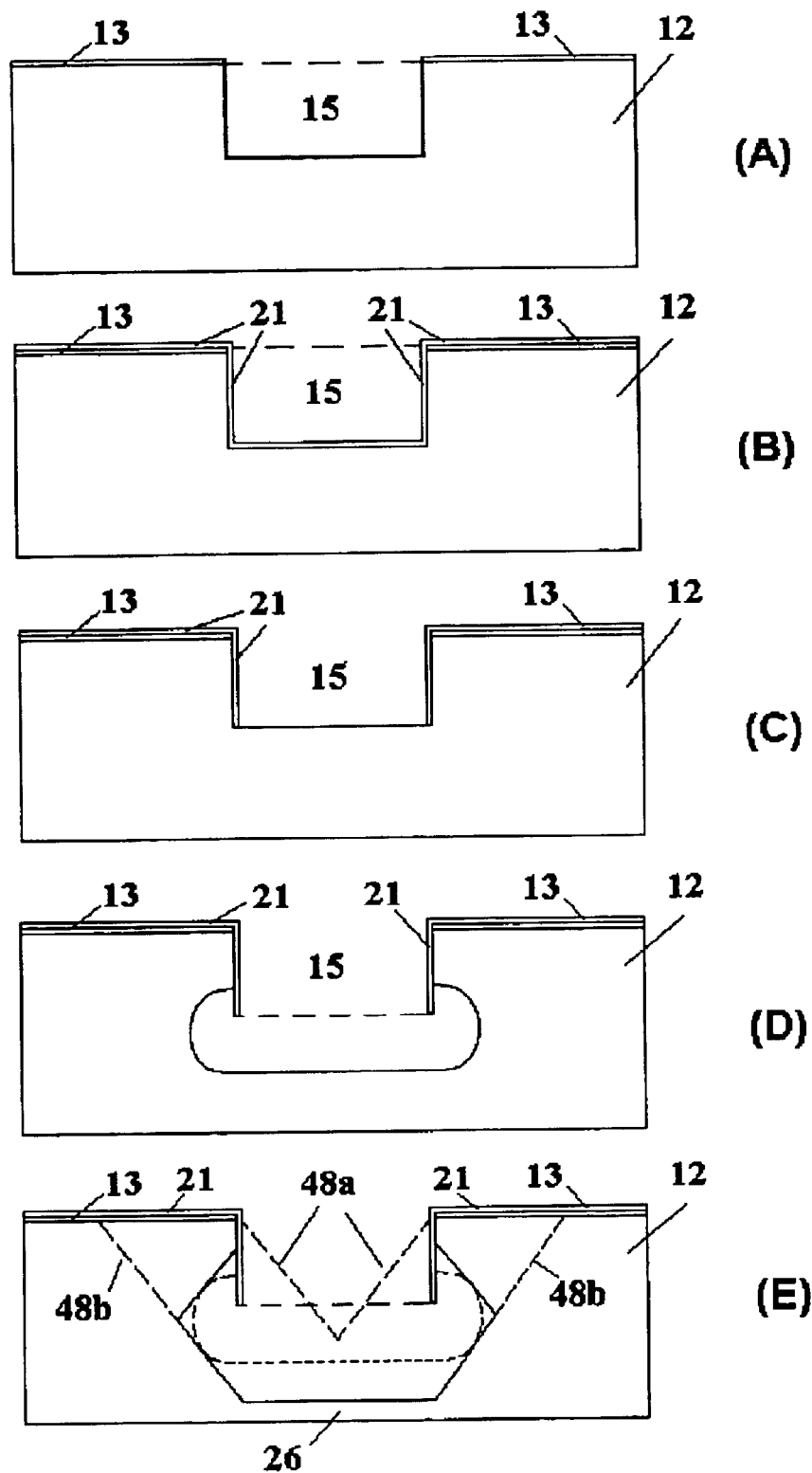
FIGS. 5(A)–(E) are cross-sectional diagrams illustrating cavities etched in a silicon wafer and representing a series of processing steps in a method according to the fourth embodiment of the present invention.

Isotropic etching then is used at the next step. Well-known in the art, etchants of a mixture of hydrofluoric (HF), nitric (HNO$_2$) and acetic (CH$_3$COOH) acids, or SF$_6$ plasma etch, or atmospheric downstream plasma (ADP) etch, or gas xenon difluoride can be used at this isotropic etch step. The profile of the cavity 15 after isotropic etching is shown in FIG. 5(D). Wet anisotropic etching is then used in the next step and the profile of the cavity is shown in FIG. 4(E). The advantage of the isotropic etch step is that the size of the diaphragm can be increased relative to that in the case of using wet anistropic etch after the second RIE etch. To get the same size of the diaphragm 26 using wet anistropic etch requires a larger initial opening 14. As evident from FIG. 5(E), for the same size diaphragm 26, the combination of RIE isotropic and anisotropic etching allows for decreased size of the initial opening 14, which in turn allows decreasing the size of the wafer die.

As illustrated in FIGS. 6(A)–6(E), the process according to the fifth embodiment includes the major initial steps of masking of the wafer 12, and forming the opening 14 in the mask 12, followed by: (a) local RIE etch (see FIG. 6(A)); (b) masking the side walls and bottom plane of the cavity 15 and removing mask 13 from the bottom plane of the cavity 15 (see FIG. 6(B); (c) local RIE etch (see FIG. 6(C)); (d) isotropic etch (see FIG. 6(D)); and (e) wet anisotropic etch (see FIG. 6(E)).

The anisotropic etch step provides for forming the diaphragm with better defined edges and with more uniform thickness than the isotropic etch does. Wet anisotropic etching also allows better cavity depth control. Therefore, combination of isotropic and anisotropic etching allows increasing size of the diaphragm 26 for the same size of the opening 14 and good control of diaphragm 26 thickness.

Figure 6:
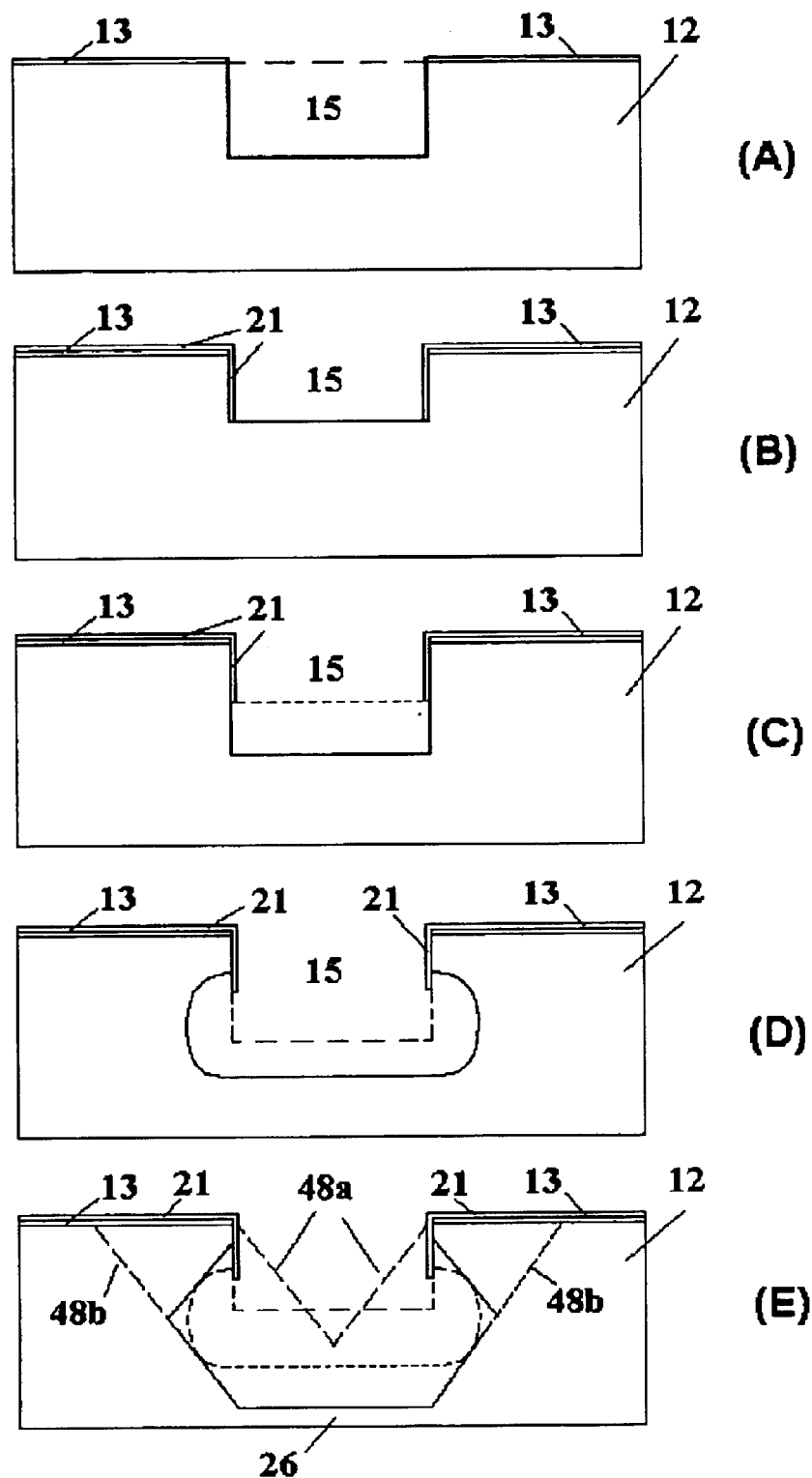
FIGS. 6(A)–(E) are cross-sectional diagrams illustrating cavities etched in a silicon wafer and representing a series of processing steps in a method according to the fifth embodiment of the present invention.

In order to realize the same size of the diaphragm 26 using wet anisotropic etching only it is necessary to use larger size of the initial opening 14. As illustrated by FIG. 6H, for the same size diaphragm 26 the combination of RIE, isotropic, and anisotropic etching allows decreasing the size of the initial opening 14 and decreasing the size of the wafer die.

Figure 7:
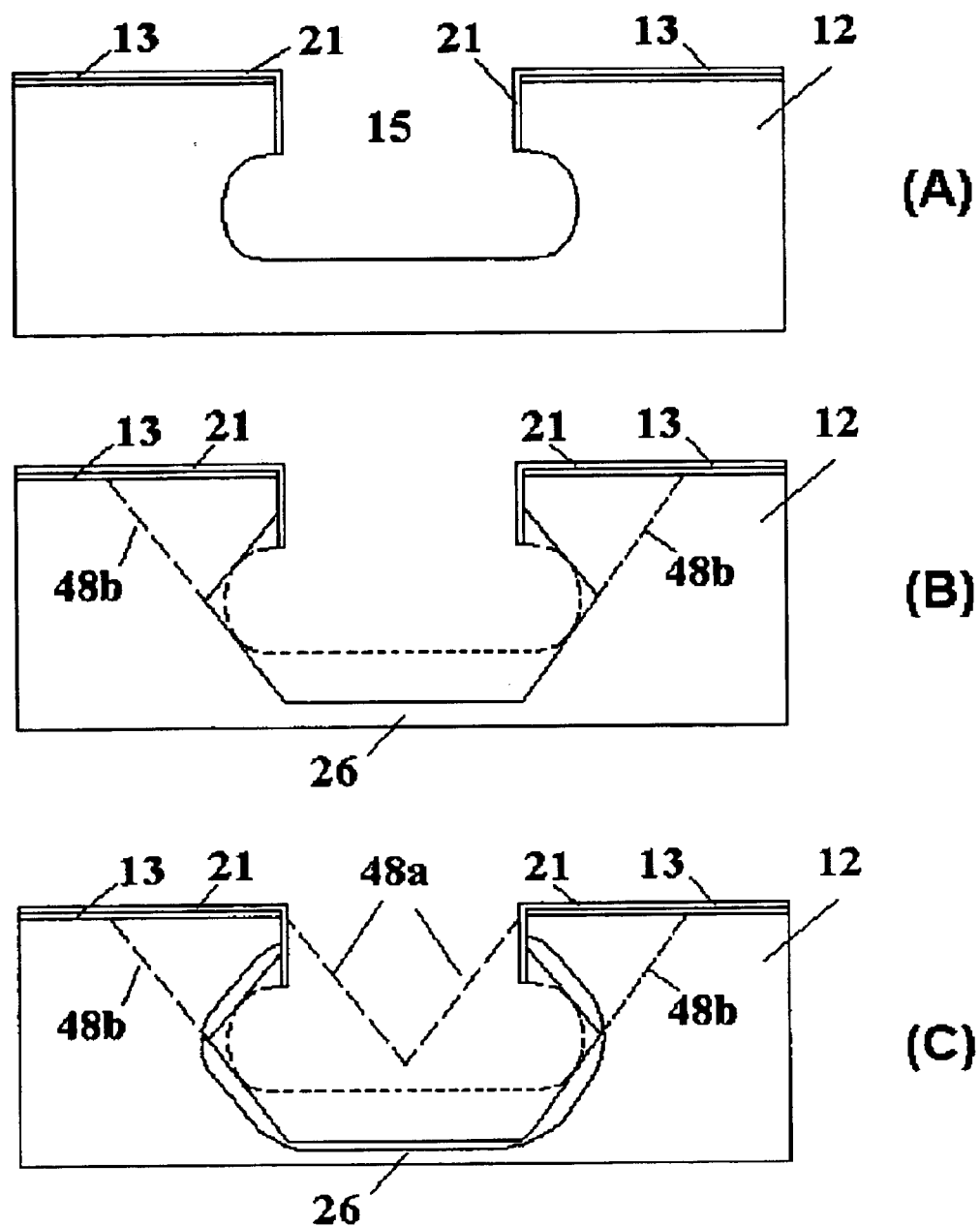
FIGS. 7(A)–(C) are cross-sectional diagrams illustrating cavities etched in a silicon wafer and representing a series of processing steps in a method according to the sixth embodiment of the present invention.
Figure 8:
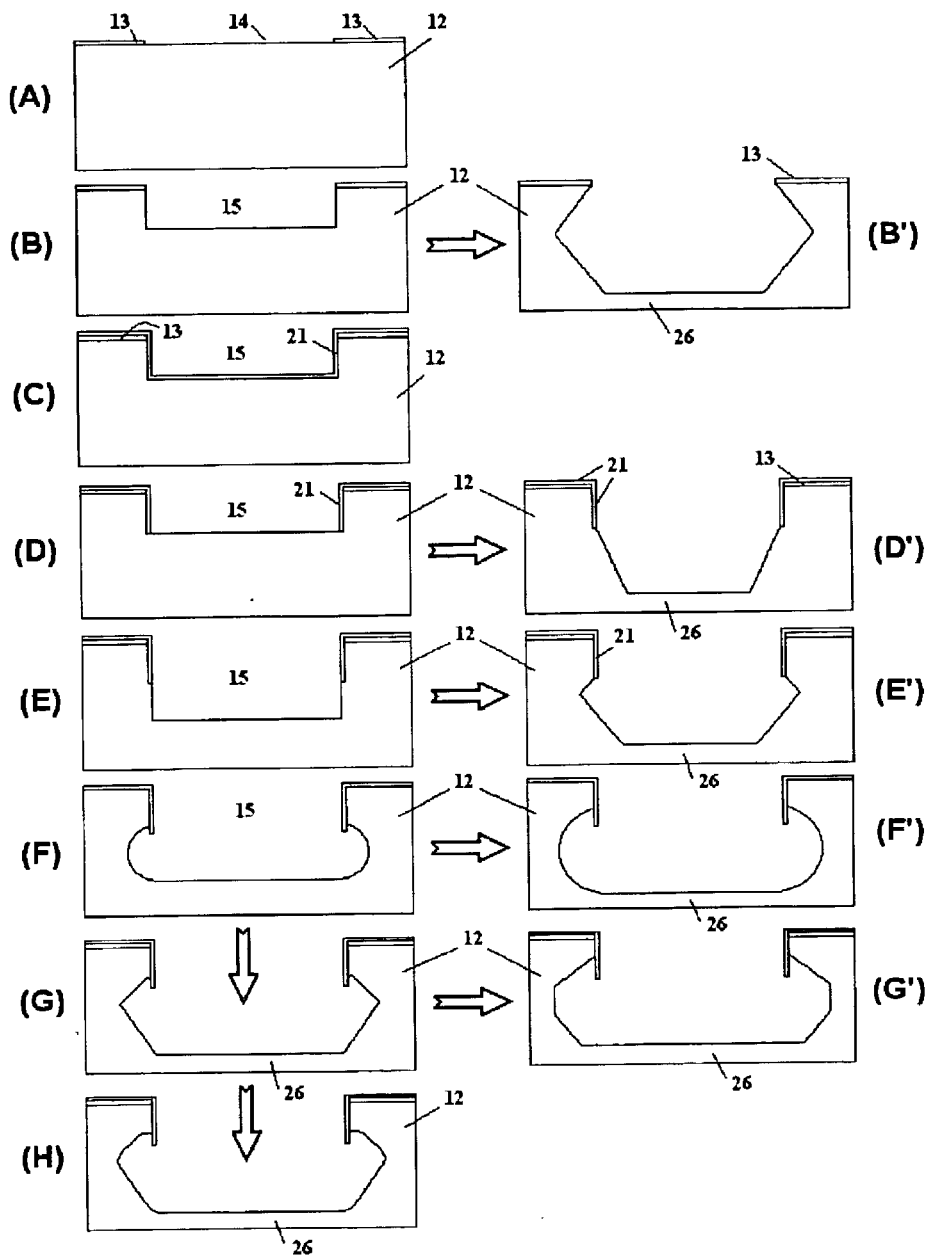
FIGS. 8(A)–(H) illustrate a summary of options of fabricating various microstructure profiles with the methods described in the illustrated embodiments.

As illustrated in FIGS. 7(A)–7(C), the process according the sixth embodiment includes the major initial steps of masking of the wafer 12, forming an opening 14 in the mask 13, local RIE etch, masking of the side walls and bottom plane of the cavity 15, removing mask 21 from the bottom plane of the cavity 15, followed by: (a) isotropic etch (see FIG. 7(A)); (b) wet anisotropic etch (see FIG. 7(B)); and (c) a second isotropic etch (see FIG. 7(C)).

The cavity 15, after wet anisotropic etching, as shown in FIGS. 6(E) and 7(C) typically has well defined edges and corners. When a profiled structure with such a cavity is mechanically loaded by a force and/or a torque then the induced mechanical stress tends to concentrate in the edge areas and corner areas. This induced stress can be deleterious to the mechanical structure and the wafer. The second isotropic etching provides rounding of corners and edges of the cavity 15 thereby improving mechanical properties of the structure and preventing cracking of the wafer 12.

The preceding described processes for profiling semiconductor wafers using multiple etch steps are summarized by FIGS. 8(A)–(H). These processes can be used for creating complex micromechanical structures on semiconductor wafers.

Figure 9:
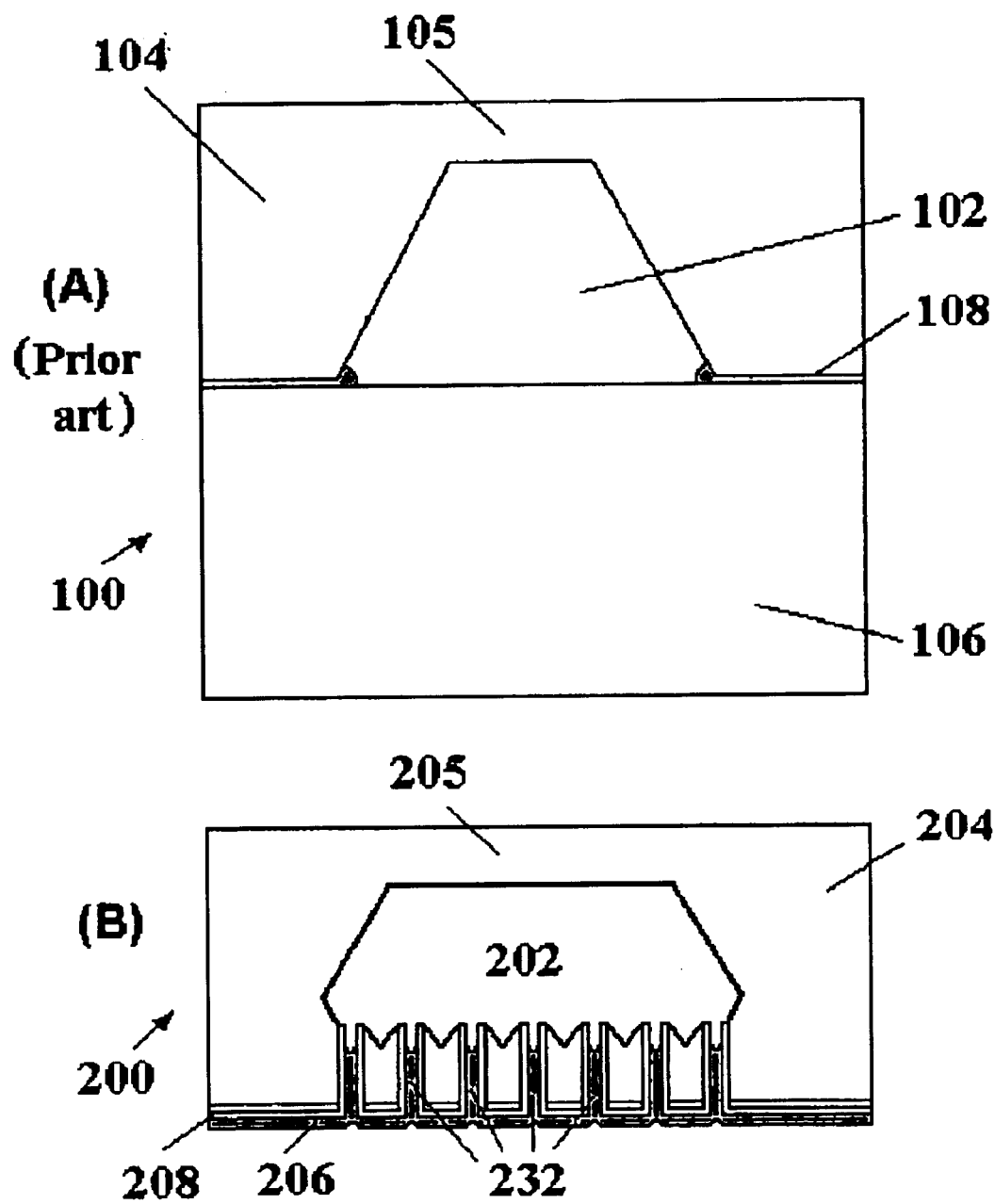
FIG. 9(A) represents a prior art structure of a silicon absolute pressure sensor.
FIG. 9(B) represents structure of a silicon absolute pressure sensor die fabricating from a microstructure according to the present invention.

The microstructures containing closed cavities and/or channels have various applications. For example, microstructure with a closed cavity and channels can be used in an absolute pressure sensor. A form of a prior art structure of an absolute pressure sensor 100 is shown in FIG. 9(A). In the structure 100, a cavity 102 in a silicon die 104 is formed using wet anisotropic etching to create a diaphragm 105. After that, the silicon die 104 is bonded with a second die 106. The second die 106 can be made of, for example, glass or silicon. In the absolute pressure sensor 100, the connection of the die 104 with the second die 106 is formed with an intermediate bonding layer 108. Frit glass can be used, for example, as the intermediate 108, which provides hermetic sealing of the cavity 102.

An absolute pressure sensor die 200 utilizing the method of the present invention is shown in FIG. 9(B). The absolute pressure sensor die 200 includes a cavity 202 in a silicon die 204 to form a diaphragm 205 with a sealing material 206 of glass, polycrystalline silicon, etc., adhered with an intermediate layer 208 and sealing channels 232. Absolute pressure sensors 200 per the present invention have several advantages in comparison with the absolute pressure sensors of the prior art. First, for the same size die the size of the diaphragm is larger, or for the same size of the diaphragm, the silicon die fabricated according to the present invention has smaller size. Besides, it is thinner, because it requires only one wafer instead of two in the prior art.

As described in the method for fabricating microstructures allows for direct formation of microstructures with channels. Such microstructures can be used in applications where forming of micro-capillaries is necessary. For example, such microstructures with internal channels can be used in microsystems for DNA analysis and blood analysis as well as in fluidic sensors. Structures pursuant to the present invention provide several advantages. First, for the same linear dimension of the die, it allows formation of micro-channels with larger cross-sectional areas than that which can be formed by wet anisotropic etching. Second, there is no need for a second die (for example, made of glass or silicon), as is typically used to form closed channels. Third, the cross-section of the channel can be controlled with accuracy when it is determined by {111} planes only.

Figure 10:
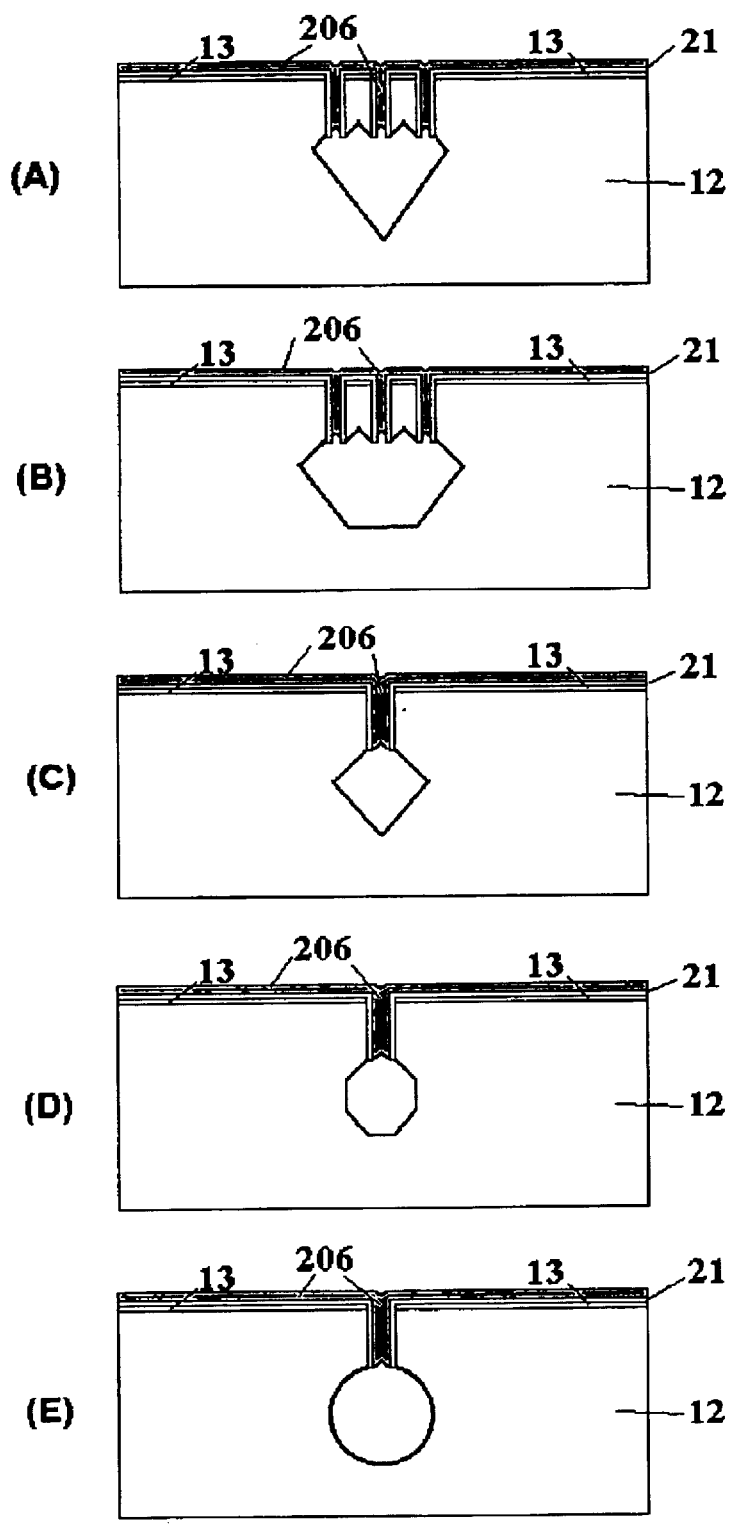
FIGS. 10(A)–(E) are cross-sectional diagrams illustrating enclosed cavities and channels fabricated in a silicon wafer according to the present invention.

The profile shown in FIG. 10(A) can be formed on silicon wafers with the following process: (a) masking of the wafer 12; (b) forming a set of openings in the mask 13; (c) RIE etching through said set of openings forming cavities with vertical walls; (d) masking the side walls and bottom plane of said cavities; (e) removing mask from the bottom plane of the outermost cavities; and (f) wet anisotropic etching. Then the layer 206 is deposited.

The profile of FIG. 10(B) can be formed on silicon wafers with the following process: (a) masking of the wafer 12; (b) forming a set of openings in the mask 13; (c) RIE etching through said set of openings forming cavities with vertical walls; (d) masking of the side walls and bottom plane of the cavities; (e) removing mask 21 from the bottom plane of the outermost cavities; (f) a second RIE etching to deepen the outer cavities; (g) wet isotropic etching; and (h) depositing sealing layer 206.

The profile of FIG. 10(C) can be formed on silicon wafers with the following process: (a) masking of the wafer 12; (b) forming an opening in the mask 13; (c) RIE etching through the opening forming a cavity with vertical walls; (d) masking the side walls and bottom plane of the cavity; (e) removing mask 21 from the bottom plane of the cavity; (f) second RIE etching to deepen the cavity; (g) wet isotropic etching; and (h) depositing sealing layer 206.

The profile of FIG. 10(D) can be formed on silicon wafers with the following process: (a) masking of the wafer 12; (b) forming an opening in the mask 13; (c) RIE etching through said opening forming a cavity with vertical walls; (d) masking the side walls and bottom of the cavity; (e) removing the mask from the bottom of the cavity; (f) wet anisotropic; (g) masking; (h) removing mask form inverting walls; (i) RIE etching to form vertical walls extending from the outward extending walls; (j) masking; (k) removing mask from bottom of the cavity; (l) wet anisotropic; and (m) depositing sealing layer 206.

The profile of FIG. 10(E) can be formed on silicon wafers with the following process: (a) masking of the wafer 12; (b) forming an opening in the mask 13; (c) RIE etching through said opening forming a cavity with vertical walls; (d) masking the side walls and bottom of the cavity; (e) removing the mask from the bottom of the cavity; (f) wet anisotropic; (g) masking; (h) removing mask from bottom-most inverting walls; (i) RIE etching to form vertical walls extending from the outward extending walls; (j) masking (k) remove mask from bottom of the cavity; (l) wet anisotropic; (m) isotropic etching; and (n) sealing layer 206.

The profile shown in FIG. 11(D) can be formed on silicon wafer 12 (FIG. 11(A)) with the following process: (a) masking the wafer 12; (b) forming a set of openings 14 in the mask 13 (FIG. 11(A)); (c) RIE etching through said set of openings forming cavities with vertical walls (FIG. 11(B)); (d) wet anisotropic etching (FIG. 11(C)); and (e) depositing sealing layer 206 (FIG. 11(E)).

Figure 12:
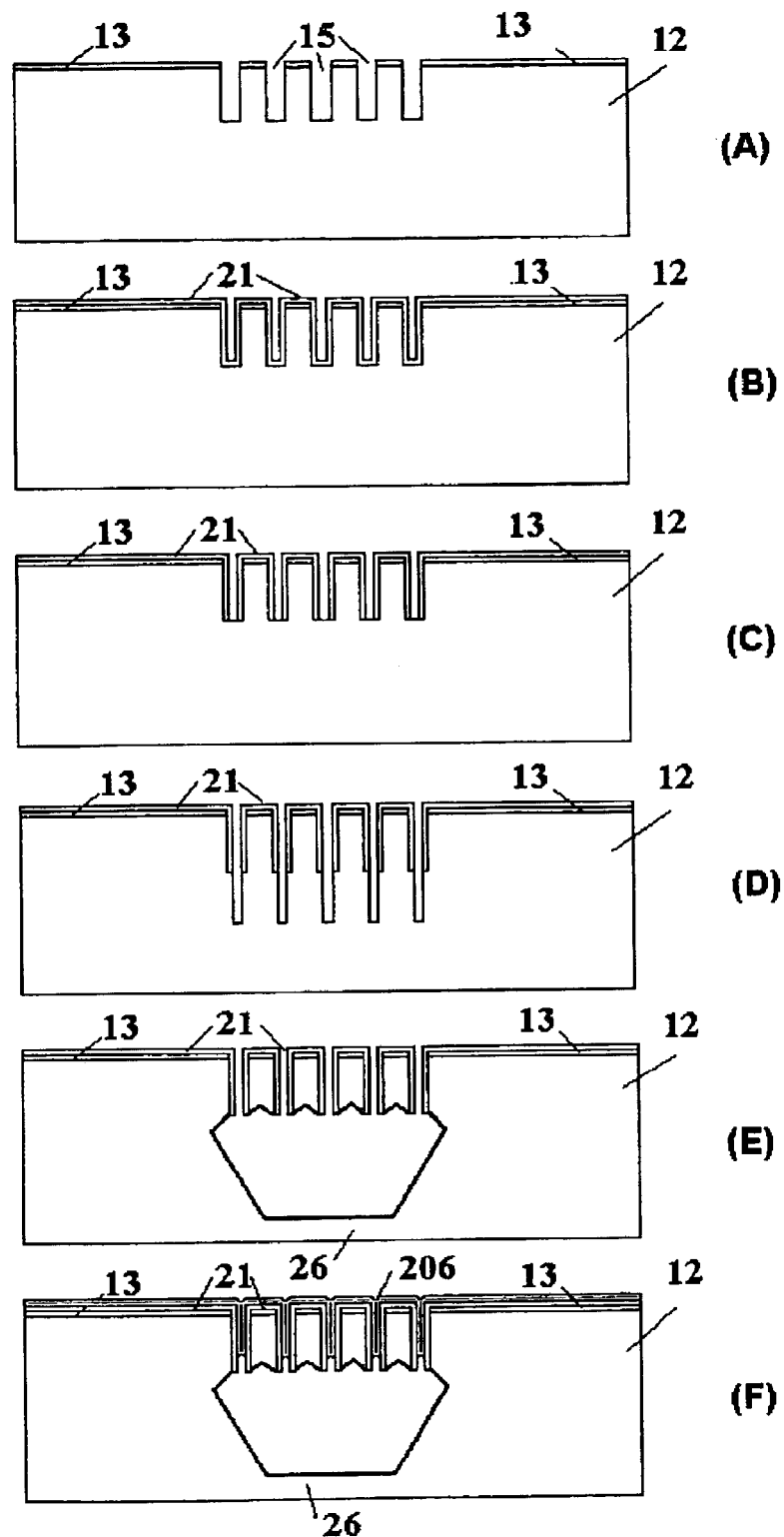
FIGS. 12(A)–(F) illustrate enclosed structure fabricated in silicon wafer according to the present invention.

The profile shown in FIG. 12(F) can be formed on silicon wafer 12 with the following process: (a) masking the wafer 12; (b) forming a set of openings 14 in the mask 13; (c) RIE etching through said set of openings forming cavities with vertical walls (FIG. 12(A)); (d) masking the side walls and bottom plane of said set of openings (FIG. 12(B)); (e) removing mask from the bottom plane of the cavities (FIG. 12(C)); (f) RIE etching to extend the cavities with vertical walls (FIG. 12(D)); (g) anisotropic etching (FIG. 12(E)); and (h) depositing sealing layer 206 (FIG. 12(F)).

FIGS. 13(A)–13(B) and 14(A)–14(B) illustrate microstructures 400, 500, 600 and 700, respectively, formed according to the method described in the present invention. These structures each contain a cavity and a grid structure formed on the surface of a silicon wafer. The bars of a grid structure can be oriented differently with respect to the side walls of the cavity depending on the masking.

Figure 13:
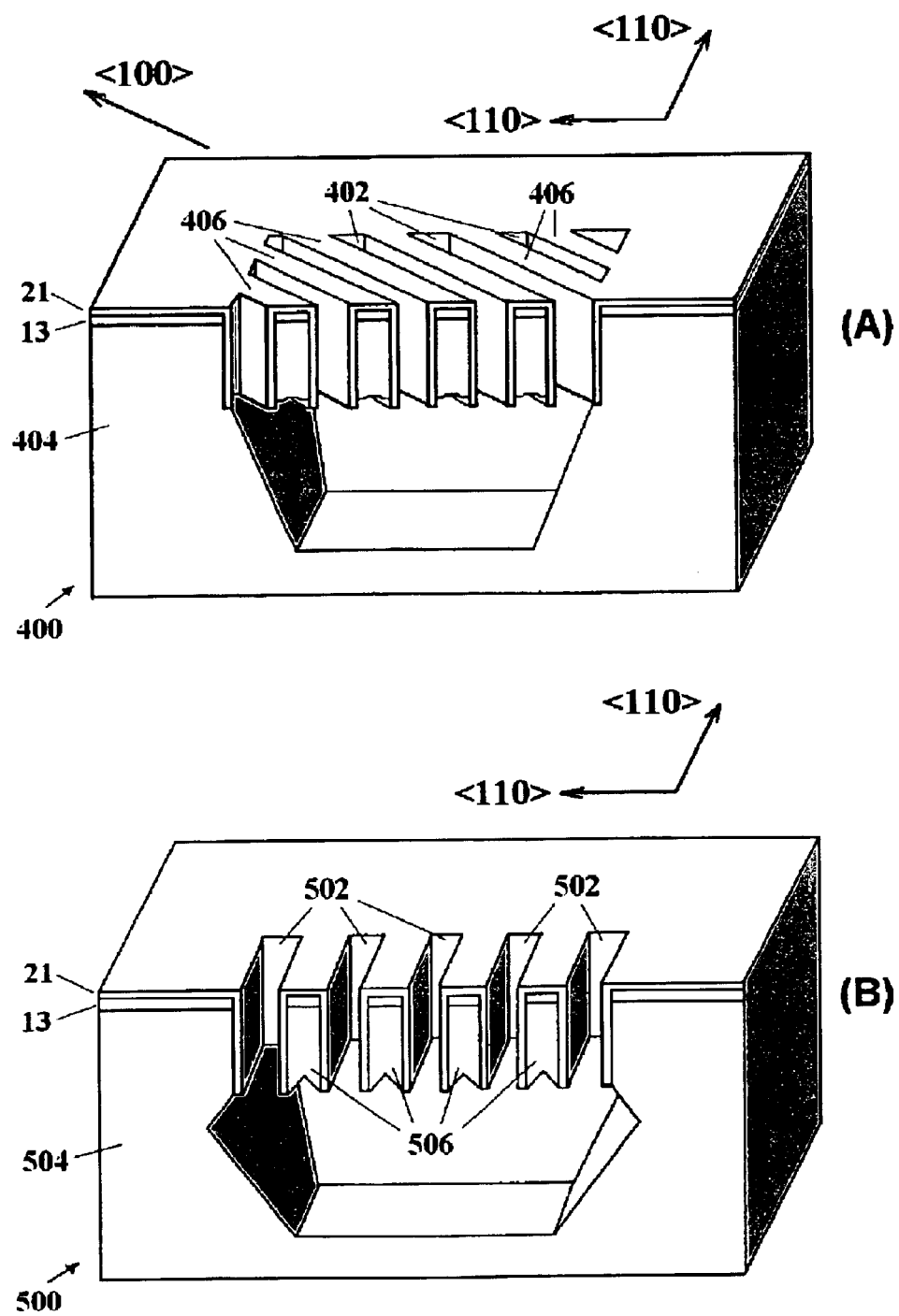
FIGS. 13(A)–(B) are perspective view of microstructures fabricated according to methods of the present invention.

The microstructure 400 of FIG. 13(A) has openings 403 with sides oriented parallel to the crystallographic directions {100} at the surface of a silicon wafer 404. Bars 406 of the grid are at a 45° an angle relative to the crystallographic direction {110}.

The microstructure 500 shown in FIG. 13(B) has openings 502 with sides oriented parallel to the crystallographic directions {110} at the surface of a silicon wafer 504. Bars 506 of the grid are parallel to the same crystallographic direction.

Figure 14:
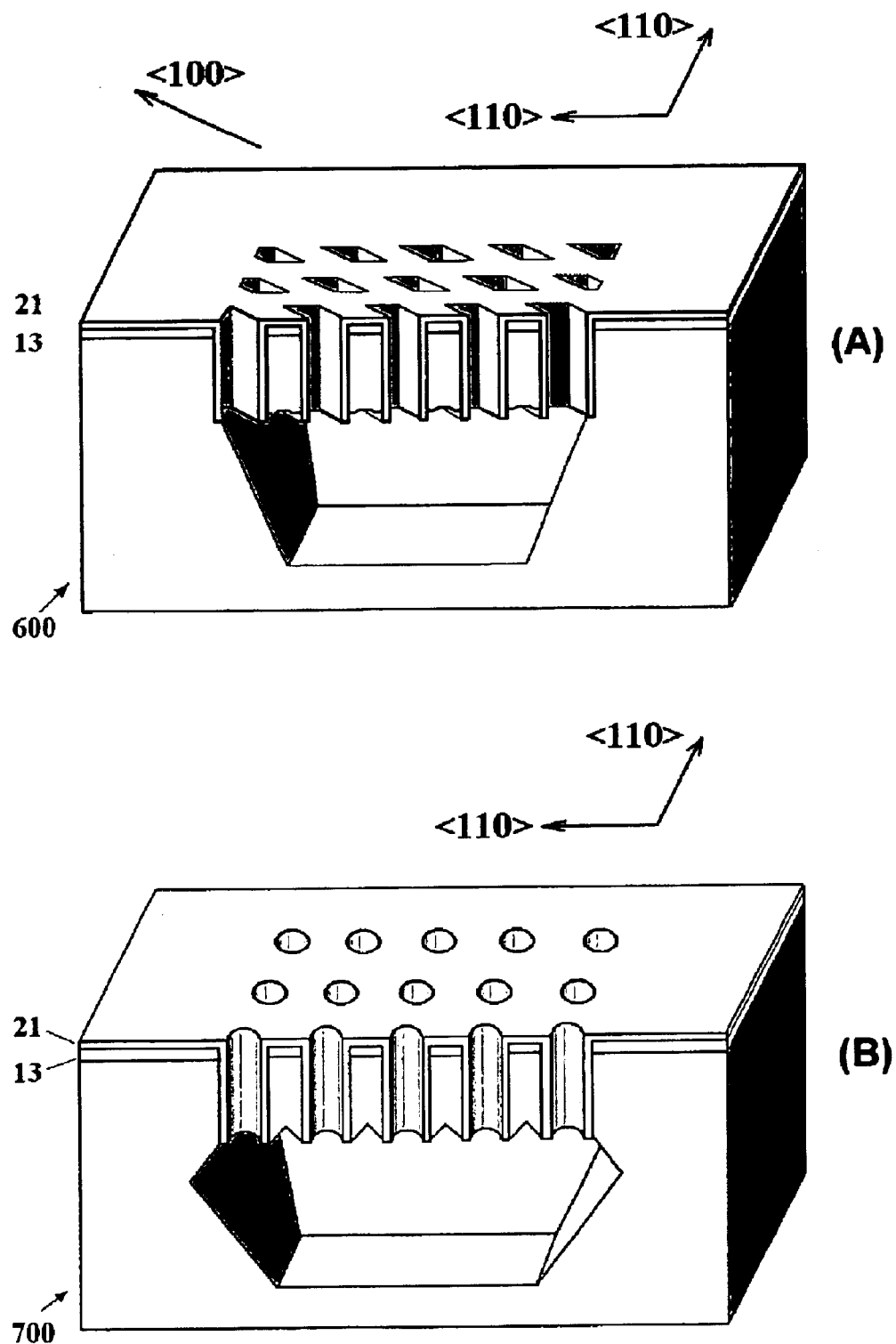
FIGS. 14(A)–(B) are perspective view of microstructures fabricated according to methods of the present invention.

In the microstructures 600 and 700 in FIG. 14(A) and 14(B), the openings are holes of different shape and different layout dependent on the masking pattern.

Figure 11:
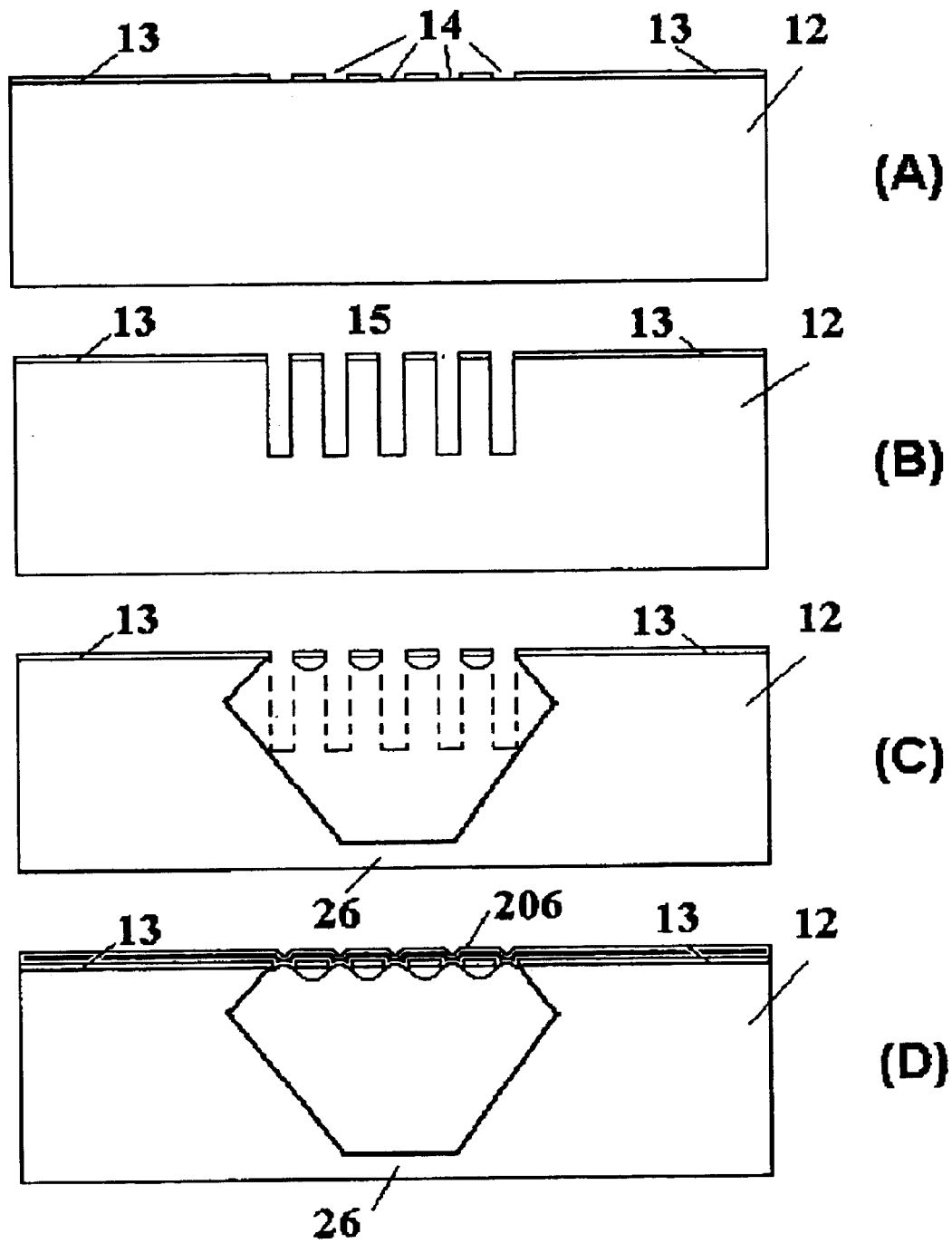
FIGS. 11(A)–(D) and 15(A)–(F) illustrate enclosed structures fabricated in a silicon wafer according to the present invention.

The grid structure shown in FIG. 11, 12, 13 and can perform various functions. Such a structure protects the cavity from particles, increases mechanical strength of the profiled silicon die and profiled silicon water, which reduces mechanical breakage of profiled silicon wafers and increases mechanical overload limits to the die. Functional elements can be fabricated within the bars, which form the grid. For example, a heater can be formed in the bars. Such a heater allows decreasing time of heating a gas or liquid in the cavity. The same structure can increase heat transfer from the cavity, i.e. can be used as a heat exchanger.

Figure 15:
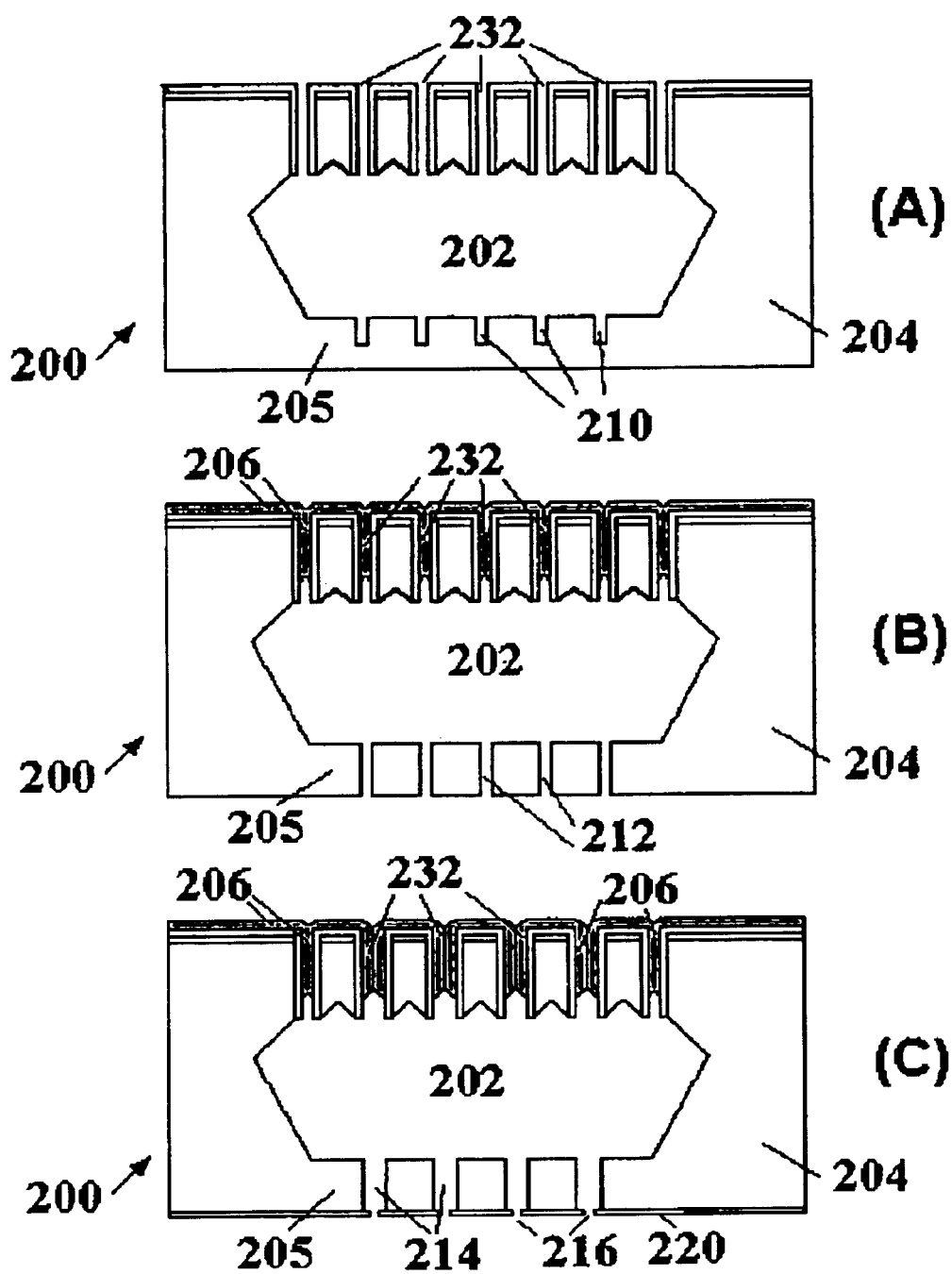

Another application of the bars or grids is that they can be used as a mask for additional etching of the bottom surface of the cavity, as shown in FIG. 15. After forming a grid with the openings 232 and cavity 202, as shown in FIG. 15(A), the bottom of the cavity can be additionally locally etched through the openings 232 by RIE etch to form channels 210. The grid or bars serve as a mask during this process. After that, the openings 232 are sealed, as shown in FIG. 15(B) with sealing layer 206. Additional local etching at the bottom of the cavity 202 forms through holes 212 in the diaphragm 205, as shown in FIG. 15(B), In a further version of this process, a layer 220 is deposited over the bottom surface of die 204 with inlets, outlets, nozzles 216 aligned with and through holes 212. This kind of structure can be useful in different microfluidic devices.

FIGS. 16(A)–16(L) show twelve different cross-sections of the micromechanical structures formed with multiple etch steps according to the present invention. Although such profiles can be useful in different applications, they are discussed herein regarding the die outer shape and shape of the cavity formed within said die. Each cross-section shown in FIGS. 16(A)–16(L) is a die cross-section, which can be obtained after wafer separation. The profile formed along die separation lines can be reconstructed assuming that the shown cross-section is a cell in a periodic structure.

Figure 16:
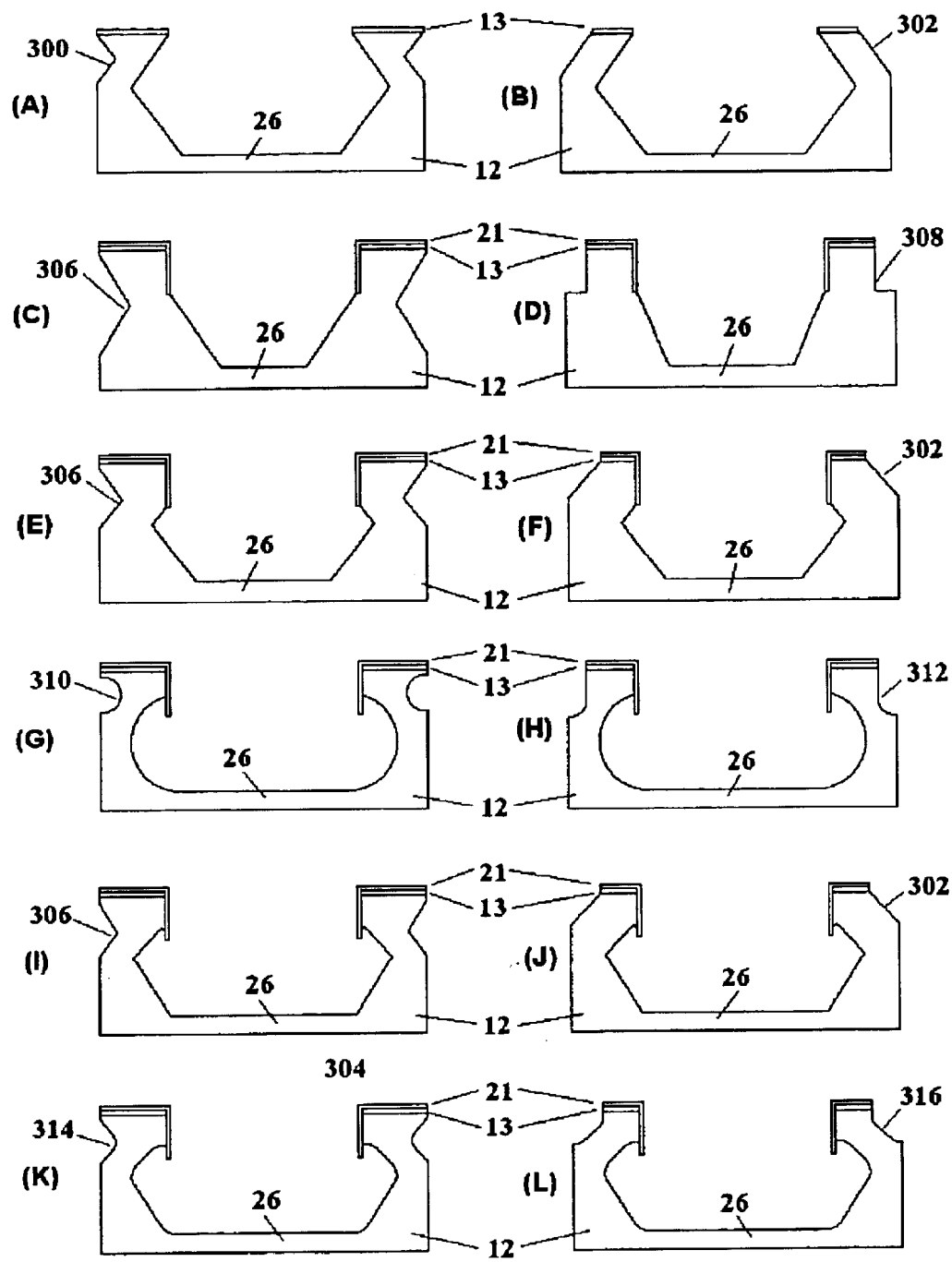
FIGS. 16(A)–(L) are cross-sectional diagrams of micromechanical structures fabricated with the method of the present invention.

FIG. 16(A) shows a profile, which can be obtained on silicon wafers with the following process: (a) masking of the wafer 12; (b) forming a first and a second set of openings in the mask 13; said first set of openings is used for etching cavities 15 located inside the die; said second set of openings is used for etching cavities between the dies; (c) RIE etching through said first and second set of openings to form cavities with vertical walls followed by; (d) wet anisotropic etch.

The openings for etching cavities between the dies can narrower than that for etching cavities inside the die. Because of these, said wet anisotropic etching allows forming diaphragms or through holes inside the die 12, and self-stop grooves 300, which shape is determined by {111} planes, are formed between the dies 12.

FIG. 16(B) shows a profile, which can be obtained on silicon wafers with the following process: (a) masking of the wafer 12; (b) forming a first and second set of openings in the mask 13; said first set of openings is used for etching cavities located inside the die; said second set of openings is used for etching cavities between the dies; (c) RIE etching through said first set of openings to form cavities with vertical walls, the second set of openings is protected during this step, for example by photoresist; and then (d) wet anisotropic etch. After wet anisotropic etching dies 12 are separated by V-grooves 302 (self-stop profile), which shape is determined by {111} planes. The diaphragm 26 or a through hole is formed within each die.

FIG. 16(C) shows a profile, which can be obtained on a silicon wafer 12 with the following process: (a) masking of the wafer 12; (b) forming a first and a second set of openings in the mask; said first set of openings is used for etching cavities located inside the die 12; the second set of openings is used for etching cavities between the dies; (c) RIE etching through said first and second sets of openings to form cavities with vertical walls; (d) masking of the side walls and bottom planes of the cavities; (e) removing mask from the bottom plane of the first set of the cavities; (f) removing mask both from the side walls and bottom plane of the second set of the cavities; and then (g) wet anisotropic etching. After wet anisotropic etching, the diaphragm 26 or through hole is formed within each die 12, closed channels 32 are formed and dies 12 are separated by grooves 306 of self-stop profile, which shape is determined by {111} planes.

FIG. 16(D) shows a profile, which can be obtained on a silicon wafer 12 with the following process; (a) masking of the wafer 12; (b) forming a first and as second set of openings in the mask 13 with said first set of openings for etching cavities located inside the die and said second set of openings for etching cavities between the dies 12; (c) RIE etching through said first and second set of openings to form cavities with the vertical walls; (d) masking the side walls and bottom planes of the cavities; (e) removing mask from the bottom plane of the first set of the cavities; and then (f) wet anisotropic etching. After wet anisotropic etching, the diaphragm 26 or through hole is formed within each die. Dies 12 are separated by U-grooves 308 with vertical walls.

FIG. 16(E) shows a profile, which can be obtained on a silicon wafer 12 with the following process: (a) masking of the wafer 12; (b) forming a first set of openings in the mask 13, said first set of openings for etching cavities located inside the die; (c) RIE etching through said first set of openings to form cavities with vertical walls; (d) masking of the side walls and bottom plane of the cavities; (e) removing mask 21 from the bottom plane of the first set of the cavities; (f) forming a second set of openings in a mask for etching cavities between the dies; (g) RIE etching through said first and second sets of openings to form cavities with vertical walls which are etched through the first set of openings and deepened and cavities with vertical walls through the second set of the openings; and then (h) wet anisotropic etching. After wet anisotropic etching, the diaphragm 26 or through hole is formed within each die and dies are separated by the grooves 306 with self-stop profile determined by {111} planes.

FIG. 16(F) shows a profile, which can be obtained on a silicon wafer 12 with the following process: (a) masking of the wafer 12; (b) forming a first set of openings in the mask 13; said first set of mask openings is used for etching cavities located inside the die 12; (c) RIE etching through said first set of mask openings to form cavities with the vertical walls; (d) masking of the side walls and bottom plane of the cavities; (e) removing mask 21 from the bottom plane of the first set of the cavities; (f) RIE etching through said first set of mask openings such that cavities with vertical walls are deepened; (g) forming a second set of mask openings for etching cavities between the dies 12; and then (h) wet anisotropic etching. After wet anisotropic etching, the diaphragm 26 or through hole is formed within each die and dies are separated by the V-grooves 302 with self-stop profile determined by the {111} planes.

FIG. 16(G) shows a profile, which can be obtained on a silicon wafer 12 with the following process: (a) masking of the wafer 12; (b) forming a first set of openings in the mask for etching cavities located inside the die 12; (c) RIE etching through said first set of mask openings to form cavities with the vertical walls; (d) masking the side walls and bottom plane of the cavities; (e) removing mask 21 from the bottom plane of the first set of the cavities; (f) forming a second set of mask for etching cavities between the dies 12; (g) RIE etching through said first and second sets of openings to form cavities with vertical walls with the cavities etched in step (c) deepened; and then (h) wet anisotropic etching. After wet anisotropic etching, the diaphragm 26 or through hole is formed within each die and the dies 12 are separated by circular grooves 310.

FIG. 16(H) shows a profile, which can be obtained on a silicon wafer 12 with the following process: (a) masking of the wafer 12; (b) forming a first and second set of openings in the mask 13 with the first set of mask openings for etching cavities located inside the die 12 and the second set of mask openings for etching cavities between the dies 12; (c) RIE etching through said first and second set of mask openings to form cavities with the vertical walls; (d) masking of the side walls and bottom plane of the cavities; (e) removing mask from the bottom plane of the first set of the cavities; (f) first isotropic etching such that said first set of cavities is deepened; (g) removing mask from the side walls and bottom plane of the second set of the cavities; and then (h) second isotropic etching. After second isotropic etching, the diaphragm 26 or through hole is formed within each die 12. Dies are separated by the U-grooves 312 with vertical walls and rounded edges.

FIG. 16(I) shows a profile, which can be obtained on a silicon wafer 12 with the following process: (a) masking of the wafer 12; (b) forming a first set of openings in the mask 13 for etching cavities located inside the die; (c) RIE etching through said first set of mask openings to form cavities with the vertical walls; (d) masking the side walls and bottom plane of the cavities; (e) removing mask from the bottom plane of the first set of the cavities; (f) forming a second set of mask openings for etching cavities between the dies; (g) RIE etching through said first and second sets of mask openings to form cavities with vertical walls with the cavities etched in step (c) deepened; and then (h) wet anisotropic etching. After wet anisotropic etching, the diaphragm 26 or through hole is formed within each die 12. Dies are separated by the grooves 306 with self-stop profile determined by {111} planes.

FIG. 16(J) shows a profile, which can be obtained on a silicon wafer 12 with the following process: (a) masking of the wafer 12; (b) forming a first set of openings in the mask 13 for etching cavities located inside the die; (c) RIE etching through said first set of mask openings to form cavities with the vertical walls; (d) masking of the side walls and bottom plane of the cavities; (e) removing mask from the bottom plane of the first set of the cavities; (f) RIE etching through said first set of mask openings to form vertical walls; (g) isotropic etching; (h) forming a second set of mask openings for etching cavities between the dies 12; and then (i) wet anisotropic etching. After wet anisotropic etching, the diaphragm 26 or through hole is formed within each die 12 and dies are separated by the V-grooves 302 with self-stop profile determined by {111} planes.

FIG. 16(K) shows a profile, which can be obtained on a silicon wafer 12 with the following process: (a) masking of the wafer 12; (b) forming a first set of openings in the mask 13 for etching cavities located inside the die; (c) RIE etching through said first set of mask openings to form cavities with the vertical walls; (d) masking the side walls and bottom plane of the cavities; (e) removing mask from the bottom plane of the first set of the cavities; (f) forming a second set of mask openings for etching cavities between the dies; (g) RIE etching through said first and second sets of openings to form cavities with vertical walls with the cavities etched in step (c) deepened; (h) first isotropic etch step; (i) wet anisotropic etching; and then (j) second isotropic etch step. After second isotropic etching, the diaphragm 26 or through hole is formed within each die. Dies are separated by grooves 314, which are obtained by combination of the four etch steps: RIE, first isotropic etching, wet anisotropic etching, and second isotropic etching.

FIG. 16(L) shows a profile, which can be obtained on a silicon wafer 12 with the following process: (a) masking of the wafer 12; (b) forming a first set of openings in the mask 13 for etching cavities located inside the die; (c) RIE etching through said first set of openings to form cavities with vertical walls; (d) masking the side walls and bottom plane of the cavities; (e) removing mask from the bottom plane of the first set of the cavities; (f) RIE etching through said first set of mask openings to form deepened cavities with the vertical walls; (g) isotropic etching; (h) forming a second set of mask openings for etching cavities between the dies 12; and then (i) wet anisotropic etching. After wet anisotropic etching, the diaphragm 26 or through hole is formed within each die and dies are separated by the grooves profile 316, which is determined by combination of wet anisotropic and isotropic etching.

It should be understood that variations of the process and geometry of microstructures, which can be formed according to the present invention, and which are described in the preferred embodiments do not limit the present invention, but only illustrate some of the various technical solutions covered by this invention.

What is claimed is:

1. Method for fabricating microstructures comprising:
   a. forming a first protective layer on a surface of a silicon wafer;
   b. forming at least one opening in said first protective layer;
   c. etching at least one cavity in said silicon wafer through said opening with at least one etching step other than anisotropic etching and with said cavity having at least part of its formed side walls at an angle larger than the minimum angle between {111} crystallographic planes and the surface of the wafer and with the depth of this etching being at least ¼ of the thickness of the wafer; and
   d. forming a microstructure with deep anisotropic etching to a depth comparable to the thickness of said silicon wafer.

2. Method of claim 1, in which the surface of said silicon wafer has crystallographic orientation (100), (110) or (111).

3. Method of claim 1, in which said protective layer contains at least one of the following materials: silicon dioxide, silicon nitride, silicon carbide, photoresist, polyimide or metal.

4. Method of claim 3, in which said opening in the protective layer is formed by lithographic process.

5. Method of claim 1, in which the etching step C is one of following reactive ion etching (RIE), plasma etching, atmospheric downstream plasma (ADP) etching, isotropic wet etching, laser etching, electromechanical etching, photoetching, electrostatic discharge etching or any combination of the above.

6. Method of claim 1, in which the angle between said surface of the silicon wafer and said at least part of side walls of said cavity is in the range of 85° . . . 95°.

7. Method of claim 1, in which said deep anisotropic etching step d, uses an etchant containing at least one of the following etch agents: alkali metal hydroxides, tetramethyl-ammonium hydroxide, ethylenediamine, hydrazine, gallic acid.

8. Method of claim 1, wherein said deep anisotropic etching step d, is performed in the presence of ultrasonic or megasonic vibrations in the etching solution.

9. Method of claim 1, wherein said microstructure contains at least one diaphragm.

10. Method of claim 1, wherein said microstructure contains at least one through hole.

11. Method of claim 7, in which said protective layer contains at least one of the following materials: silicon dioxide, silicon nitride, silicon carbide, photoresist, polyimide or metal.

12. Method of claim 11, wherein deep anisotropic etching is performed in the presence of ultrasonic or megasonic vibrations in the etching solution.

13. Method for fabricating microstructures comprising:
   a. forming a first protective layer on a surface of a silicon wafer;
   b. forming at least one opening in said first protective layer;
   c. etching at least one cavity in said silicon wafer through said opening with at least one etching step other than anisotropic etching and with said cavity having at least part of its formed side walls at an angle larger than the minimum angle between {111} crystallographic planes and the surface of the wafer;
   d. forming a microstructure with deep anisotropic etching;
   e. forming a second protective layer on a side wall and the bottom of said cavity after step c;
   f. removing said second protective layer from the bottom of said cavity; and then
   g. conducting step d.

14. Method of claim 13, in which a surface of said silicon wafer has crystallographic orientation (100), (110) or (111).

15. Method of claim 13, in which said first protective layer contains at least one of the following materials: silicon dioxide, silicon nitride, silicon carbide, photoresist, polyimide or metal.

16. Method of claim 13, in which said opening in the protective layer is formed by photolithographic process.

17. Method of claim 13, in which the etching step of step c is one of the following etching processes: reactive ion etching (RIE), plasma etching, isotropic wet etching, laser etching, electromechanical etching, photoetching, electrostatic discharge etching or any combination of the above.

18. Method of claim 13, in which the angle between major surface of the semiconductor wafer and said side walls of said cavity is in the range of 85° . . . 95°.

19. Method of claim 13, in which said second protective layer contains at least one of the following materials: silicon dioxide, silicon nitride, silicon carbide, photoresist, polyimide or metal.

20. Method of claim 13, wherein said deep anisotropic etching uses at least one of the following etching agents: alkali metal hydroxide, tetramethyl-ammonium hydroxide, ethylenediamine, hydrazine, gallic acid.

21. Method of claim 13, wherein said deep anisotropic etching is performed in the presence of ultrasonic or megasonic vibrations in the etching solution.

22. Method of claim 13, wherein microstructure contains at least one diaphragm.

23. Method for fabricating microstructures comprising:
   a. forming a first protective layer on a surface of a silicon wafer, wherein said protective layer contains at least one of the following materials: silicon dioxide, silicon nitride, silicon carbide, photoresist, polyimide or metal
   b. forming at least one opening in said first protective layer;
   c. etching at least one cavity in said silicon wafer through said opening with at least one etching step other than anisotropic etching and with said cavity having at least part of its formed side walls at an angle larger than the minimum angle between {111} crystallographic planes and the surface of the wafer;
   d. forming a microstructure with deep anisotropic etching, said microstructure containing at least one through-hole, and wherein said deep anisotropic etching;
   uses an etchant containing at least one of the following etch agents; alkali metal hydroxides, tetramethyl-ammonium hydroxide, ethylenediamine, hydrazine, gallic acid; and
   is performed in the presence of ultrasonic or megasonic vibrations in the etching solution.

24. Method of claim 13, further comprising an additional isotropic etching step after said deep anisotropic etching.

25. Method of claim 24, in which said isotropic etching is wet chemical etching using at least one of the following etch agents: nitric acids, hydrofluoric acid, acetic acid.

26. Method of claim 24, in which said isotropic etching is plasma etching.

27. Method of claim 13, wherein a RIE etching step and isotropic etching step precede said deep anisotropic etching step.

28. Method of claim 27, in which said isotropic etching is wet chemical etching using at least one of the following etch agents; nitric acids, hydrofluoric acid, acetic acid.

29. Method of claim 27, in which said isotropic etching is plasma etching.

30. Method of claim 27, in which said isotropic etching is gas xenon difluoride etching.

31. Method of claim 13, further comprising an additional isotropic etching step after said deep anisotropic etching.

32. Method of claim 31, in which said additional isotropic etching is wet chemical etching using at least one for the following etch agents: nitric acids, hydrofluoric acid, acetic acid.

33. Method of claim 31, in which said additional isotropic etching is plasma etching.

34. Method of claim 31, in which said isotropic etching is gas xenon difluoride etching.

35. Method for fabricating microstructures comprising:
a. forming a first protective layer on a surface of a silicon wafer;
b. forming at least one opening in said first protective layer;
c. etching at least one cavity in said silicon wafer through said opening with at least one etching step other than anisotropic etching and with said cavity having at least part of its formed side walls at an angle larger than the minimum angle between {111} crystallographic planes and the surface of the wafer;
d. forming a microstructure with deep anisotropic etching;
h. forming a second protective layer on a side wall and bottom of said cavity after stel c.
i. removing said second protective layer from the bottom of said cavity;
j. deepening said cavity with an etching step other than anisotropic etching and forming cavity side walls with an angle larger than the minimum angle between {111} planes and the surface of the wafer and then conducting step d.

36. Method of claim 35, in which surface of said silicon wafer has crystallographic orientation (100), (110) or (111).

37. Method of claim 35, in which said first protective layer formed on the surface of said silicon wafer contains at least one of the following materials: silicon dioxide, silicon nitride, silicon carbide, photoresist, polyimide or metal.

38. Method of claim 35, in which said at least one opening in the protective layer is formed by lithographic process.

39. Method of claim 35, in which the etching step of step c is one of the following processes: reactive ion etching (RIE), plasma etching, isotropic wet etching, laser etching, electromechanical etching, photoetching, electrostatic discharge etching or any combination of the above.

40. Method of claim 35, in which the angle between said major surface of the semiconductor wafer and said side walls of said cavity is in the range of 85° . . . 95°.

41. Method of claim 35, in which said second protective layer contains at least one of the following materials: silicon dioxide, silicon nitride, silicon carbide, photoresist, polyimide or metal.

42. Method of claim 35, wherein said deep anisotropic etching uses at least one of the following etching agents: alkali metal hydroxide, tetramethyl-ammonium hydroxide, ethylenediamine, hydrazine, gallic acid.

43. Method of claim 35, wherein said deep anisotropic etching is performed in the presence of ultrasonic or megasonic vibrations in the etching solution.

44. Method of claim 35, wherein said microstructure contains at least one diaphragm.

45. Method of claim 35, wherein said microstructure contains at least one through hole.

46. Method of claim 35, further comprising an additional isotropic etching step after said deep anisotropic etching.

47. Method of claim 46, in which said isotropic etching is wet chemical etching using at least one of the following etch agents: nitric acids, hydrofluoric acid, acetic acid.

48. Method of claim 46, in which said isotropic etching is plasma etching.

49. Method of claim 35, wherein a RIE etching step and isotropic etching step precedes said deep anisotropic etching step.

50. Method of claim 49, in which said isotropic etching is wet chemical etching using at least one of the following etch agents: nitric acids, hydrofluoric acid, acetic acid.

51. Method of claim 49, in which said isotropic etching is plasma etching.

52. Method of claim 49, in which said isotropic etching is gas xenon difluoride.

53. Method of claim 35, further comprising an additional isotropic etch step after said deep anisotropic etching.

54. Method of claim 53, in which said isotropic etching is wet chemical etching using at least one of the following agents: nitric acids, hydrofluoric acid, acetic acid.

55. Method of claim 53, in which said isotropic etching is plasma etching.

56. Method for fabricating microstructures comprising:
a. forming a first protective layer on a surface of a silicon wafer;
b. forming a plurality of openings in said first protective layer;
c. etching a plurality of cavities in said silicon wafer through said openings with at least one etching step other than anisotropic etching and with said cavities having at least part of their formed side walls at an angle larger than the minimum angle between {111} planes and the surface of said silicon wafer; and at least some of said cavities being separated by formed side walls; and
d. forming a microstructure with deep anisotropic etching with at least one of said silicon walls separating adjacent cavities partially etched through to connect at least two of said cavities after said deep anisotropic etching.

57. Method of claim 56, in which surface of said silicon wafer has crystallographic orientation (100), (110) or (111).

58. Method of claim 56, in which said first protective layer contains at least one of the following materials: silicon dioxide, silicon nitride, silicon carbide, photoresist, polyimide or metal.

59. Method of claim 58, in which at least one of said openings in the protective layer is formed by lithographic process.

60. Method of claim 56, in which the etching step of step c is one of the following: reactive ion etching (RIE), plasma etching, isotropic wet etching, laser etching, electromechanical etching, photoetching, electrostatic discharge etching or any combination of the above.

61. Method of claim 56, in which the angle between said surface of the silicon wafer and said at least part of side walls of said cavity is in the range if 85° . . . .95°.

62. Method of claim 56, in which said deep anisotropic etching step d, uses an etchant containing at least one of the following etching agents: alkali metal hydroxide, tetramethyl-ammonium hydroxide, ethylenediamine, hydrazine, gallic acid.

63. Method of claim 56, wherein said deep anisotropic etching step d, is performed in the presence of ultrasonic or megasonic vibrations in the etching solution.

64. Method of claim 59, in which said protective layer contains at least one of the following materials: silicon dioxide, silicon nitride, silicon carbide, photoresist, polyimide or metal.

65. Method of claim 64, wherein deep anisotropic etching is performed in the presence of ultrasonic or megasonic vibrations in the etching solution.

66. Method for fabricating microstructure comprising:
a. forming a first protective layer on a surface of a silicon wafer;
b. forming at least one opening in said first protective layer;
c. etching at least one cavity in said silicon wafer through said opening with at least one etching step other than anisotropic etching and with said cavity having at least part of its formed side walls at an angle larger than the minimum angle between {111} crystallographic planes and the surface of the wafer;

d. forming a microstructure with deep anisotropic etching; and k. an additional step of deposition of a material on the surface of silicon waver; said deposition of a material closes the opening in said protective layer.

67. Method of claim 66, wherein said material contains at least one of the following substances: polycrystalline silicon, silicon, dioxide, silicon nitride, silicon carbide, gold, copper, nickel, silver, parylene, teflon or spin-on-glass.

68. Method of claim 66, wherein said silicon wafer contains at least one sealed cavity.

69. Method of claim 68, wherein the pressure in said sealed cavity is below atmosphere pressure.

70. Method of claim 66, wherein said cavity is a channel inside a silicon wafer.

71. Method of claim 66, wherein at least one of the linear dimensions of said opening is smaller than ten micrometers.

72. Method of claim 56, further comprising the steps of:

e. forming a second protective layer on the side wall and on the bottom of at least one of said plurality of cavities;

f. removing said second protective layer from said bottom and then conducting step d; and g. forming a microstructure with deep anisotropic etching.

73. Method of claim 72, in which surface of said silicon wafer has crystallographic orientation (100), (110) or (111).

74. Method of claim 72, in which said first protective layer contains at least one of the following materials: silicon dioxide, silicon nitride, silicon carbide, photoresist, polyimide or metal.

75. Method of claim 72, in which said plurality of openings in said openings in said first protective layer is formed, by lithographic process.

76. Method of claim 72, in which the etching step of step c is one of the following etching processes: reactive ion etching (RIE), plasma etching, isotropic wet etching, laser etching, electromechanical etching, photodetecting, electrostatic discharge etching or any combination of the above.

77. Method of claim 72, in which the angle between said major structure of the semiconductor wafer and said vertical side walls of said cavity is in the range of 85° . . . 95°.

78. Method of claim 72, in which said second protective layer contains at least one of the following materials: silicon dioxide, silicon nitride, silicon carbide, photoresist, polyimide or metal.

79. Method of claim 72, wherein said deep anisotropic etching uses at least one of the following etching agents: alkali metal hydroxide, tetramethyl-ammonium hydroxide, ethylenediamine, hydrazine, gallic acid.

80. Method of claim 72, wherein said deep anisotropic etching is performed in the presence of ultrasonic or megasonic vibrations in the etching solution.

81. Method of claim 72, wherein said microstructure contains bar on grid-like structure and at least one diaphragm.

82. Method of claim 72, wherein said microstructure contains bar or grid-like structure and at least one through hole.

83. Method of claim 72, further comprising an additional isotropic etching step after said deep anisotropic etching.

84. Method of claim 83, in which said isotropic etching is wet chemical etching using at least one of the following etch agents: nitric acids, hydrofluoric acid, acetic acid.

85. Method of claim 83, in which said isotropic etching is plasma etching.

86. Method of claim 72, wherein a RIE etching step and isotropic etching step precede said deep anisotropic etching step.

87. Method of claim 86, in which said isotropic etching is wet chemical etching using at least one of the following etch agents: nitric acids, hydrofluoric acid, acetic acid.

88. Method of claim 86, in which said isotropic etching is plasma etching.

89. Method of claim 72, further comprising an additional isotropic etching step after said deep anisotropic etching.

90. Method of claim 86, in which said additional isotropic etching is wet chemical etching using at least one of the following etch agents: nitric acids, hydrofluoric acid, acetic acid.

91. Method for fabricating microstructures comprising:

a. forming a first protective layer on a surface of a silicon wafer;

b. forming a plurality of openings in said first protective layer;

c. etching a plurality of cavities in said silicon wafer through said openings with at least one etching step other than anisotropic etching and with cavities having at least part of their formed side walls at an angle larger than the minimum angle between planes and the surface of the wafer;

d. forming a second protective layer on said side walls and on the bottom of said plurality of cavities;

e. removing said second protective layer from the bottom of at least some cavities;

f. deepening said plurality of cavities with etching step other than anisotropic with side walls forming with the surface of said silicon wafer an angle larger than the minimum angle between {i11} planes and the surface of the wafer; and g. forming a microstructure with deep anisotropic etching.

92. Method of claim 91, in which surface of said silicon wafer has crystallographic orientation (100), (110) or (111).

93. Method of claim 91, in which said first protective layer contains at least one of the following materials: silicon dioxide, silicon nitride, silicon carbide, photoresist, polyimide or metal.

94. Method of claim 91, in which said plurality of openings in said first protective layer is formed by lithographic process.

95. Method of claim 91, in which the etching step of step c is one of the following processes: reactive ion etching (RIE), plasma etching, isotropic wet etching, laser etching, electromechanical etching, photoetching, electrostatic discharge etching or any combination thereof.

96. Method of claim 91, in which the angle between said major surface of the semiconductor wafer and said side walls of said cavity is in the range of 85° . . . 95°.

97. Method of claim 91, in which said second protective layer contains at least one of the following materials: silicon dioxide, silicon nitride, silicon carbide, photoresist, polyimide or metal.

98. Method of claim 91, wherein said deep anisotropic etching of step c uses at least one of the following etching agents: alkali metal hydroxide, tetramethyl-ammonium hydroxide, ethylenediamine, hydrazine, gallic acid.

99. Method of claim 91, wherein said deep anisotropic etching of step c is performed in the presence of ultrasonic or megasonic vibrations in the etching solution.

100. Method of claim 91, wherein said wafer contains bar or grid-like structure and at least one diaphragm.

101. Method of claim 91, wherein said microstructure contains bar on grid-like structure and at least one through hole.

102. Method of claim 91, wherein said, microstructure contains bar or grid-like structure and at least one channel.

103. Method of claim 102, further comprising an additional isotropic etching step after said deep anisotropic etching.

104. Method of claim 103, in which said isotropic etching is wet chemical etching using at least one of the following etch agents: nitric acids, hydrofluoric acid, acetic acid.

105. Method of claim 104, in which said isotropic etching is plasma etching.

106. Method of claim 91, wherein two etching steps other than isotropic and anisotropic etching are used for said deepening of at least one cavity before said deep anisotropic etching and with the first of said two etch steps being reactive ion etching (RIE) and the second of said two steps is isotropic etching.

107. Method of claim 106, wherein said isotropic etching is wet chemical etching using at least one of the following etch agents: nitric acids, hydrofluoric acid, acetic acid.

108. Method of claim 106, wherein isotropic etching is plasma etching.

109. Method of claim 91, further comprising the additional step of local RIE etching of the bottom of the cavity through the openings in the grid-like structure at the surface of the wafer, whereby said opening in the grid-like structure serves as a mask.

110. Method of claim 109, further comprising an additional step of deposition of a material on the surface of silicon wafer for closing the opening in said grid-like structure.

111. Method for fabricating microstructures according to claim 109, where said material of the deposition step contains at least one of the following substances: polycrystalline silicon, silicon dioxide, silicon nitride, silicon carbide, gold, copper, nickel, silver, parylene, polyimide. Teflon and spin-on-glass.

112. Method of claim 91, further comprising the steps of:
   h. local deposition of the masking material to the bottom of the cavity through the openings in the grid-like structure at the surface of the wafer, whereby said openings in the grid-like structure serve as a mask; and
   i. local etching of the unmasked areas at the bottom of the cavity through the openings in the grid-like structure at the surface of the wafer.

113. Method of claim 91, further comprising an additional isotropic etching step after said deep anisotropic etching of step g.

114. Method of claim 113, in which said additional isotropic etching is wet chemical etching using at least one of the following etch agents: nitric acids, hydrofluoric acid, acetic acid.

115. Method of claim 113, in which said isotropic etching is plasma etching.

* * * * *